US012104249B2

(12) United States Patent
Martinson et al.

(10) Patent No.: US 12,104,249 B2
(45) Date of Patent: Oct. 1, 2024

(54) SEQUENTIAL INFILTRATION SYNTHESIS OF GROUP 13 OXIDE ELECTRONIC MATERIALS

(71) Applicants: UCHICAGO ARGONNE, LLC, Chicago, IL (US); THE UNIVERSITY OF CHICAGO, Chicago, IL (US)

(72) Inventors: Alex B. Martinson, Naperville, IL (US); Seth B. Darling, Chicago, IL (US); Ruben Waldman, Chicago, IL (US)

(73) Assignees: UCHICAGO ARGONNE, LLC, Chicago, IL (US); THE UNIVERSITY OF CHICAGO, Chicago, IL (US)

( * ) Notice: Subject to any disclaimer, the term of this patent is extended or adjusted under 35 U.S.C. 154(b) by 546 days.

(21) Appl. No.: 16/515,718

(22) Filed: Jul. 18, 2019

(65) Prior Publication Data
US 2021/0017649 A1 Jan. 21, 2021

(51) Int. Cl.
*C23C 16/40* (2006.01)
*C08L 33/08* (2006.01)
*C08L 33/12* (2006.01)
*C08L 39/06* (2006.01)
*C23C 16/455* (2006.01)

(52) U.S. Cl.
CPC ........ *C23C 16/45553* (2013.01); *C08L 33/08* (2013.01); *C08L 33/12* (2013.01); *C08L 39/06* (2013.01); *C23C 16/407* (2013.01); *C23C 16/45527* (2013.01)

(58) Field of Classification Search
CPC .................................................. C23C 16/407
See application file for complete search history.

(56) References Cited

U.S. PATENT DOCUMENTS

| | | | |
|---|---|---|---|
| 6,162,591 A | 12/2000 | Gao et al. | |
| 7,163,641 B2 | 1/2007 | Donohoe et al. | |
| 7,399,709 B1 | 7/2008 | Lin et al. | |
| 8,900,467 B1 | 12/2014 | Chapuis et al. | |
| 8,986,562 B2 | 3/2015 | Zafiropoulo et al. | |
| 9,416,447 B2 | 8/2016 | Arora et al. | |
| 9,487,600 B2 | 11/2016 | Darling et al. | |
| 9,684,234 B2 | 6/2017 | Darling et al. | |
| 2005/0082543 A1 | 4/2005 | Alizadeh et al. | |
| 2005/0103748 A1 | 5/2005 | Yamaguchi et al. | |
| 2006/0231525 A1 | 10/2006 | Asakawa et al. | |
| 2009/0101985 A1 | 4/2009 | Fuller et al. | |
| 2009/0181171 A1 | 7/2009 | Cheng et al. | |
| 2010/0092873 A1 | 4/2010 | Sills et al. | |
| 2010/0248476 A1 | 9/2010 | Sera et al. | |
| 2011/0206905 A1 | 8/2011 | Buriak et al. | |
| 2012/0046421 A1 | 2/2012 | Darling et al. | |
| 2012/0241411 A1 | 9/2012 | Darling et al. | |
| 2013/0157409 A1 | 6/2013 | Vaidya et al. | |
| 2013/0207238 A1 | 8/2013 | Cooper et al. | |
| 2013/0256265 A1* | 10/2013 | Darling | H01L 21/3081 216/49 |
| 2014/0024220 A1 | 1/2014 | Chang et al. | |
| 2017/0137577 A1 | 5/2017 | Darling et al. | |
| 2017/0203258 A1* | 7/2017 | Darling | B01D 69/12 |
| 2018/0010248 A1* | 1/2018 | Darling | C23C 16/06 |

FOREIGN PATENT DOCUMENTS

WO   WO-2008/135749   11/2008

OTHER PUBLICATIONS

Adamo & Barone, "Toward reliable density functional methods without adjustable parameters: The PBE0 model," The Journal of Chemical Physics 110(13), pp. 6158-6170 (1999).
Amirtharaj et al. "Double Patterning and Hyper-Numerical Aperture Immersion Lithography" via http://www.ece.umd.edu/class/enee416/GroupActivities/Lithography%20Presentation.pdf; Nov. 17, 2011, 16 pages.
Atwood, et al., "Cyclic trimeric hydroxy, amido, phosphido, and arsenido derivatives of aluminum and gallium. X-ray structures of [tert-Bu2Ga(.mu.-OH)]3 and [tert-Bu2Ga(.mu.-NH2)]3," Organometallics 12(1), pp. 24-29 (1993).
Baravelli, et al., "VDD scalability of FinFET SRAMs: Robustness of different design options against LER-induced variations," Solid-State Electronics 54(9), pp. 909-918 (2010).
Barry, et al., "Mitigating oil spills in the water column," Environmental Science: Water Research & Technology 4(1), pp. 40-47 (2018).
Berman, et al., "Sequential Infiltration Synthesis for the Design of Low Refractive Index Surface Coatings with Controllable Thickness," ACS Nano 11(5), pp. 2521-2530 (2017).
Bierwagen, "Indium oxide-a transparent, wide-band gap semiconductor for (opto)electronic applications," Semiconductor Science and Technology 30(2), 024001, 16 pages (2015).
Biswas, et al., "New Insight into the Mechanism of Sequential Infiltration Synthesis from Infrared Spectroscopy," Chemistry of Materials 26(21), pp. 6135-6141 (2014).
Blum, et al., "Ab initio molecular simulations with numeric atom-centered orbitals," Computer Physics Communications 180(11), pp. 2175-2196 (2009).

(Continued)

*Primary Examiner* — David P Turocy
(74) *Attorney, Agent, or Firm* — FOLEY & LARDNER LLP

(57) ABSTRACT

The sequential infiltration synthesis (SIS) of group 13 indium and gallium oxides ($In_2O_3$ and $Ga_2O_3$) into polymethyl methacrylate (PMMA) thin films is demonstrated. Examples highlight the an SIS process using trimethylindium (TMIn) and trimethylgallium (TMGa), respectively, with water. In situ Fourier transform infrared (FTIR) spectroscopy reveals that these metal alkyl precursors reversibly associate with the carbonyl groups of PMMA in analogy to trimethylaluminum (TMAl), however with significantly lower affinity. SIS with TMIn and water enables the growth of $In_2O_3$ at 80° C., well below the onset temperature of atomic layer deposition (ALD) using these precursors.

15 Claims, 11 Drawing Sheets

(56) References Cited

OTHER PUBLICATIONS

Cao, et al., "Charge Transfer Dynamics of Phase-Segregated Halide Perovskites: CH3NH3PbCl3 and CH3NH3PbI3 or (C4H9NH3)2(CH3NH3)n-1PbnI3n 1 Mixtures," ACS Applied Materials & Interfaces 11(9), pp. 9583-9593 (2019).

Chai, Jinan, Ordering Functional Nanostructures via Self-Assembly of Block Copolymers; University of Alberta, Spring 2009, 196 pages.

Dandley, et al., "Temperature-dependent reaction between trimethylaluminum and poly(methyl methacrylate) during sequential vapor infiltration: experimental and ab initio analysis," Journal of Materials Chemistry C 2(44), pp. 9416-9424 (2014).

Diaz, et al., "An experimentally validated analytical model for gate line-edge roughness (LER) effects on technology scaling," IEEE Electron Device Letters 22(6), pp. 287-289 (2001).

Dreeskornfeld, et al., "High Precision Etching of Si/ SiO2 on a High-Density Helicon Etcher for Nanoscale Devices," Journal of the Electrochemical Society 150(11), pp. G702-G706 (2003).

Elam, et al., "Atomic Layer Deposition of Indium Tin Oxide Thin Films Using Nonhalogenated Precursors," The Journal of Physical Chemistry C 112(6), pp. 1938-1945 (2008).

Elam, et al., "New Insights into Sequential Infiltration Synthesis," ESC Transactions 69(7), pp. 147-157 (2015).

Endo, et al., "High Sensitive Negative Silylation Process for 193nm Lithography," Microelectronic Engineering 53(1-4), pp. 485-488 (2000).

Final Office Action on U.S. Appl. No. 13/427,619 dated Aug. 13, 2014, 22 pages.

Frascaroli, et al., "Ozone-Based Sequential Infiltration Synthesis of Al2O3 Nanostructures in Symmetric Block Copolymer," ACS Applied Materials & Interfaces 8(49), p. 33933-33942 (2016).

Frase, et al., "CD Characterization of Nanostructures in SEM Metrology," Measurement Science and Technology 18(2), pp. 510-519 (2007).

Goldfarb, et al., "Effect of Thin-Film Imaging on Line Edge Roughness Transfer to Underlayers During Etch Processes," Journal of Vacuum Science & Technology B 22(2), pp. 647-653 (2004).

Goner, et al., "Low-Temperature Al2O3 Atomic Layer Deposition," Chemistry of Materials 16(4), pp. 639-645 (2004).

Hartney, et al., "Silylation Processes for 193-nm Excimer Laser Lithography," Advances in Resist Technology and Processing VI 1262, pp. 119-130 (1990).

Hoch, et al., "The Rational Design of a Single-Component Photocatalyst for Gas-Phase CO2 Reduction Using Both UV and Visible Light," Advanced Science 1(1), 1400013, 10 pages (2014).

Hutton, et al., "Application of Plasmask R resist and the DESIRE process to lithography at 248 nm," Journal of Vacuum Science & Technology B 8(6), pp. 1502-1508 (1990).

Ishchenko, et al., "Investigating Sequential Vapor Infiltration Synthesis on Block-Copolymer-Templated Titania Nanoarrays," The Journal of Physical Chemistry C 120(13), pp. 7067-7076 (2016).

Jur, et al., "Temperature-dependent subsurface growth during atomic layer deposition on polypropylene and cellulose fibers," Langmuir 26(11), pp. 8239-8244 (2010).

Kim, et al., "Electrical, optical, and structural properties of indium-tin-oxide thin films for organic light-emitting devices," Journal of Applied Physics 86(11), pp. 6451-6461 (1999).

King & Veal, "Conductivity in transparent oxide semiconductors," Journal of Physics: Condensed Matter 23(33), 17 pages (2011).

Kontziampasis, et al., "Optimized Surface Silylation of Chemically Amplified Expoxidized Photoresists for Micromachining Applications," Journal of Applied Polymer Science 117(4), pp. 2189-2195 (2010).

Lee, et al., "Mobility Analysis of Surface Roughness Scattering in FinFET Devices," Solid-State Electronics 62(1), pp. 195-201 (2011).

Leng & Losego, "Vapor phase infiltration (VPI) for transforming polymers into organic-inorganic hybrid materials: a critical review of current progress and future challenges," Materials Horizons 4(5), pp. 747-771 (2017).

Libera, et al., "Indium Oxide Atomic Layer Deposition Facilitated by the Synergy between Oxygen and Water," Chemistry of Materials 23(8), pp. 2150-2158 (2011).

Lopez, et al., "XPS O 1s binding energies for polymers containing hydroxyl, ether, ketone and ester groups," Surface and Interface Analysis 17(5), pp. 267-272 (1991).

Lucas et al. "Triple patterning in 10 nm mode metal lithography" http://spie.org/x91233.xml ; Nov. 26, 2012, 3 pages.

Luo, et al., "Optical Characterization and Process Control of Top Surface Imaging," MRS Proceedings 584, pp. 183-188 (2000).

Ma, et al., "Line Edge Roughness of Sub-100 nm Dense and Isolated Features: Experimental Study," Journal of Vacuum Science & Technology B 21(6), pp. 3124-3130 (2003).

Maeng, et al., "Highly Conducting, Transparent, and Flexible Indium Oxide Thin Film Prepared by Atomic Layer Deposition Using a New Liquid Precursor Et2InN(SiMe3)2," ACS Applied Materials & Interfaces 6(2), pp. 17481-17488 (2014).

Mane, et al., "Indium Oxide Thin Films by Atomic Layer Deposition Using Trimethylindium and Ozone," The Journal of Physical Chemistry C 120(18), pp. 9874-9883 (2016).

Mason, et al., "Hydrolysis of tri-tert-butylaluminum: the first structural characterization of alkylalumoxanes [(R2Al)2O]n and (RAlO)n," Journal of the American Chemical Society 115(12), pp. 4971-4984 (1993).

Nam & Stein, "Extreme Carrier Depletion and Superlinear Photoconductivity in Ultrathin Parallel-Aligned ZnO Nanowire Array Photodetectors Fabricated by Infiltration Synthesis," Applied Optical Materials 5(24), 1700807, 11 pages (2017).

Nam, et al., "Direct fabrication of high aspect-ratio metal oxide nanopatterns via sequential infiltration synthesis in lithographically defined SU-8 templates," Journal of Vacuum Science & Technology B 33, 06F201 (2015).

Nam, et al., "Electrical and structural properties of ZnO synthesized via infiltration of lithographically defined polymer templates," Applied Physics Letters 107, 203106, X pages (2015).

Noda, et al., "Group Frequency Assignments for Major Infrared Bands Observed in Common Synthetic Polymers," Physical Properties of Polymers Handbook, pp. 395-406 (2007).

Non-Final Office Action for U.S. Appl. No. 13/209,190 dated Sep. 21, 2015, 13 pages.

Non-Final Office Action on U.S. Appl. No. 13/427,619 dated Mar. 11, 2014, 21 pages.

Notice of Allowance for U.S. Appl. No. 13/209,190, dated Jun. 17, 2016, 7 pages.

Notice of Allowance for U.S. Appl. No. 13/427,619, dated Dec. 1, 2014, 9 pages.

Ocola, et al., "Infiltrated Zinc Oxide in Poly(methyl methacrylate): An Atomic Cycle Growth Study," The Journal of Physical Chemistry C 121(3), pp. 1893-1903 (2017).

Office Action for U.S. Appl. No. 13/209,190, dated Jun. 10, 2015, 12 pages.

Office Action for U.S. Appl. No. 13/209,190, dated Nov. 24, 2014, 13 pages.

Office Action for U.S. Appl. No. 13/902,169, dated May 18, 2015, 17 pages.

Office Action for U.S. Appl. No. 14/645,162, mail date Nov. 18, 2016, 13 pages.

Parsons, et al., "Mechanisms and reactions during atomic layer deposition on polymers," Coordination Chemistry Reviews 257 (23-24), pp. 3323-3331 (2013).

Peng, et al., "A Route to Nanoscopic Materials via Sequential INfiltration Synthesis on Block Copolymer Templates," ACS Nano 5(6), pp. 4600-4606 (2011).

Peng, et al., "Nanoscopic Patterned Materials with Tunable Dimensions via Atomic Layer Deposition on Block Copolymers," Advanced Materials 22(45), pp. 5129-5133 (2010).

Perdew, et al., "Generalized Gradient Approximation Made Simple," Physical Review Letters 77(18), pp. 3865-3868 (1996).

Shenai-Khatkhate, et al., "Accurate vapor pressure equation for trimethylindium in OMVPE," Journal of Crystal Growth 310(7-9), pp. 2395-2398 (2008).

(56) References Cited

OTHER PUBLICATIONS

Subramanian, et al., "Review of Recent Advances in Applications of Vapor-Phase Material Infiltration Based on Atomic Layer Deposition," JOM 71(1), pp. 185-196 (2018).

Tseng, et al., "Enhanced Block Copolymer Lithography Using Sequential Infiltration Synthesis," The Journal of Physical Chemistry C 115(36), pp. 17725-17729 (2011).

US Office Action for U.S. Appl. No. 13/209,190, mailed Apr. 6, 2016, 14 pages.

US Office Action for U.S. Appl. No. 13/902,169, mailed Mar. 24, 2016, 16 pages.

US Office Action for U.S. Appl. No. 13/902,169, mailed Sep. 18, 2015, 16 pages.

Wang, et al., Nanoscopic Morphologies in Block Copolymer Nanorods as Templates for Atomic-Layer Deposition of Semiconductors, Advanced Materials (Jul. 20, 2009), 21, 2763-2766, 4 pages.

Weimer, et al., "Template-Free Vapor-Phase Growth of Patronite by Atomic Layer Deposition," Chemistry of Materials 29(7), pp. 2864-2873 (2017).

Yang, et al., "Reversible and Irreversible Reactions of Trimethylaluminum with Common Organic Functional Groups as a Model for Molecular Layer Deposition and Vapor Phase Infiltration," Advanced Materials Interfaces 4(18), 1700237, 10 pages (2017).

Ye, et al., "Effects of Residual Solvent Molecules Facilitating the Infiltration Synthesis of ZnO in a Nonreactive Polymer," Chemistry of Materials 29(10), pp. 4535-4545 (2017).

Yin, et al., "Highly ordered TiO2 nanostructures by sequential vapour infiltration of block copolymer micellar films in an atomic layer deposition reactor," Journal of Materials Chemistry C 1(5), pp. 1029-1036 (2013).

Zhang, et al., "Indium tin oxide films prepared by radio frequency magnetron sputtering method at a low processing temperature," Thin Solid Films 376(1-2), pp. 255-263 (2000).

Zhou, et al., "Fabrication of Nanoporous Alumina Ultrafiltration Membrane with Tunable Pore Size Using Block Copolymer Templates," Advanced Functional Materials 27(34), 1701756, 12 pages (2017).

Zilko, "Metal Organic Chemical Vapor Deposition: Technology and Equipment," Handbook of Thin Film Deposition Processes and Techniques: Principles, Methods, Equipment and Applications, pp. 151-203 (2001).

Agbenyeke, et al., "Thermal atomic layer deposition of In2O3 thin films using dimethyl(N-ethoxy-2,2-dimethylcarboxylicpropanamide)indium and H2O," Applied Surface Science 419, pp. 758-763 (2017).

Banerjee, et al., "Characterization of tin doped indium oxide films prepared by electron beam evaporation," Solar Energy Materials 13(1), pp. 11-23 (1986).

Barry, et al., "Advanced oil sorbents using sequential infiltration synthesis," Journal of Materials Chemistry A 5(6), pp. 2929-2935 (2017).

Biswas, et al., "Kinetics for the Sequential Infiltration Synthesis of Alumina in Poly(methyl methacrylate): An Infrared Spectroscopic Study," The Journal of Physical Chemistry C 119(26), pp. 14585-14592 (2015).

Cianci, et al., "Trimethylaluminum Diffusion in PMMA Thin Films during Sequential Infiltration Synthesis: In Situ Dynamic Spectroscopic Ellipsometric Investigation," Advanced Materials Interfaces 5(20), 1801016, 10 pages (2018).

Emery, et al., "Epitaxial Atomic Layer Deposition of Sn-Doped Indium Oxide," Crystal Growth & Design 16(2), pp. 640-645 (2016).

Girardeaux & Pireaux, "Analysis of Poly(methyl methacrylate) (PMMA) by XPS," Surface Science Spectra 4, pp. 134-137 (1996).

Gong & Parsons, "Quantitative in situ infrared analysis of reactions between trimethylaluminum and polymers during Al2O3 atomic layer deposition," Journal of Materials Chemistry 22(31), pp. 15672-15682 (2012).

Hiraoka & Mashita, "Ab initio study on the dimer structures of trimethylaluminum and dimethylaluminumhydride," Journal of Crystal Growth 145(1-2), pp. 473-477 (1994).

Ingram & Jur, "Properties and Applications of Vapor Infiltration into Polymeric Substrates," JOM 71(1), pp. 238-245 (2018).

Jeon, et al., "Pareto Optimal Spectrally Selective Emitters for Thermophotovoltaics via Weak Absorber Critical Coupling," Advanced Energy Materials 8(25), 1801035, 9 pages (2018).

Kim, et al., "Mechanistic understanding of tungsten oxide in-plane nanostructure growth via sequential infiltration synthesis," Nanoscale 10(7), pp. 3469-3479 (2018).

Kumar & Kasiviswanathan, "Role of oxygen vacancies in the high-temperature thermopower of indium oxide and indium tin oxide films," Semiconductor Science and Technology 24(2), 025028, 7 pages (2009).

Lopes & Jaeger, "Hierarchical Self-Assembly of Metal Nanostructures on Diblock Copolymer Scaffolds", Nature 414, pp. 735-738 (2001).

Maeng, et al., "Atomic layer deposition of highly conductive indium oxide using a liquid precursor and water oxidant," Ceramics International 41(9)(A), pp. 10782-10787 (2015).

Oehrlein, et al., "Plasma-polymer Interactions: A review of Progress in Understanding Polymer Resist Mask Durability During Plasma Etching for Nanoscale Fabrication," Journal of Vacuum Science & Technology B 29(1), 010801, 35 pages (2011).

Olynick, et al., "25 nm Mechanically Buttressed High Aspect Ration Zone Plates: Fabrication and Performance," Journal of Vacuum Science & Technology B 22(6), pp. 3186-3190 (2004).

Park, et al., "Block Copolymer Lithography: Periodic Arrays of 10-11, Holes in 1 Square Centimeter", Science, 276(6317), pp. 1401-1404 (1997).

Pierrat, et al., Prime Process for Deep UV and e-beam Lithography, Microelectronic Engineering 11(1-4), pp. 507-514 (1990).

Poirier, et al., "Two-Dimensional Liquid Phase and the px.sqroot.3 Phase of Alkanethiol Self-Assembled Monolayers on Au(111)," Langmuir 10(10), pp. 3383-3386 (1994).

Ras, et al., "Hollow Inorganic Nanospheres and Nanotubes with Tunable Wall Thickness by Atomic Layer Deposition on Self-Assembled Polymeric Templates", Advanced Materials 19(1), pp. 102-106 (2007).

Rio, et al., "Study on Line Edge Roughness for Electron Beam Acceleration Voltages from 50 to 5 kV," Journal of Vacuum Science & Technology B 27(6), pp. 2512-2517 (2009).

Salami, et al., "Atomic layer deposition of ultrathin indium oxide and indium tin oxide films using a trimethylindium, tetrakis(dimethylamino)tin, and ozone precursor system," Journal of Vacuum Science & Technology A 27, 010905, 11 pages (2019).

Satou, et al., "Study of Bi-layer Silylation Process for 193 nm Lithography," Journal of Photopolymer Science and Technology 12(4), pp. 687-692 (1999).

Somervell, et al., "Study of the Fundamental Contributions to Line Edge Roughness in a 193 nm, Top Surface Imaging Systems," Journal of Vacuum Science & Technology B 18(5), pp. 2551-2559 (2000).

Thackeray, et al., "Approaches to Deep Ultraviolet Photolithography Utilizing Acid Hardened Resin Photoresist Systems," Journal of Vacuum Science & Technology B 7(6), pp. 1620-1623 (1989).

Tseng, et al., "Enhanced Lithographic Imaging Layer Meets Semiconductor Manufacturing Specification a Decade Early," Advanced Materials 24(19), pp. 2608-2613 (2012).

Tseng, et al., "Enhanced Polymeric Lithography Resists via Sequential Infiltration Synthesis," Journal of Materials Chemistry 21(32), pp. 11722-11725 (2011).

Tseng, et al., "Etch Properties of Resists Modified by Sequential Infiltration System," Journal of Vacuum Science & Technology B 29(6), 06FG01, 4 pages (2011).

Tuda, et al., "Profile Evolution During Polysilicon Gate Etching With Low-Pressure High-Density Cl2/HBr/O2 Plasma Chemistries," Journal of Vacuum Science & Technology A 19(3), pp. 711-717 (2011).

Vertommen, et al., "Integrated Silylation and Dry Development of Resist for sub-0.15μm Top Surface Imaging Applications," Journal of Photopolymer Science and Technology 11(4), pp. 597-612 (1998).

(56) References Cited

OTHER PUBLICATIONS

Waldman, et al., "Sequential Infiltration Synthesis of Al2O3 in Polyethersulfone Membranes," JOM 71(1), pp. 212-223 (2019).

Weisbord, et al., "Nano Spray-Dried Block Copolymer Nanoparticles and Their Transformation into Hybrid and Inorganic Nanoparticles," Advanced Functional Materials, 1808932, 11 pages (2019).

Xiong, et al., "Gate Line Edge Roughness Effects in 50 nm Bulk MOSFET Devices, Metrology," SPIE Proceedings 4689, Metrology, Inspection, and Process Control for Microlithography XVI, pp. 733-741 (2002).

Ye et al., "Statistical Modeling and Simulation of Threshold Variation Under Random Dopant Fluctuations and Line-Edge Roughness," IEEE Transactions on Very Large Scale Integration (VLSI) Systems 19(6), pp. 987-996 (2011).

Amirtharaj & Kruder, "Double Patterning and Hyper-Numerical Aperture Immersion Lithography," retrieved from http://www.ece.umd.edu/class/enee416/GroupActivities/Lithography%20Presentation.pdf, 16 pages, accessed Nov. 17, 2011.

Kumar, "Indium Tin Oxide Films: State-of-the-Art In Synthesis and Properties," Materials Technology: Advanced Performance Materials 10(9-10), pp. 202-206 (1995).

Tseng, et al., "Enhanced Block Copolymer Lithography Using Sequential Infiltration Synthesis," The Journal of Physical Chemistry C 115, pp. 17725-17729 (2011).

* cited by examiner

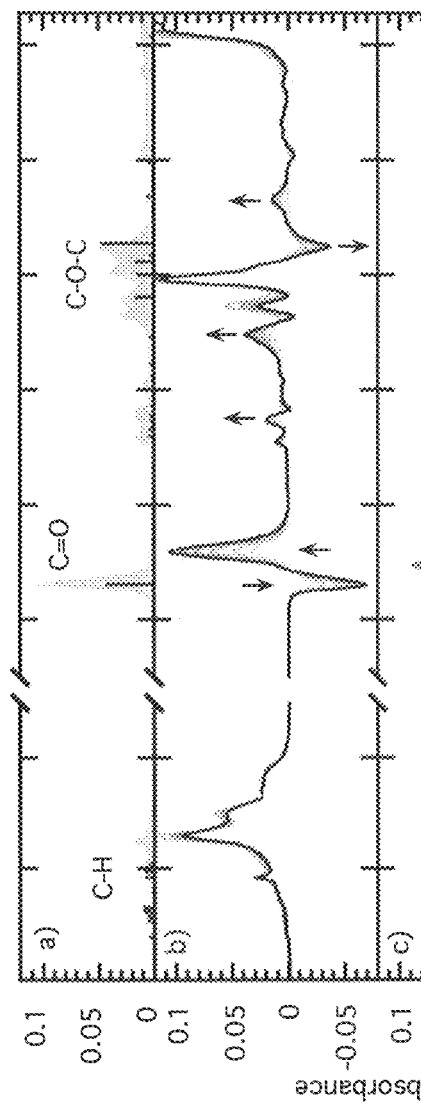
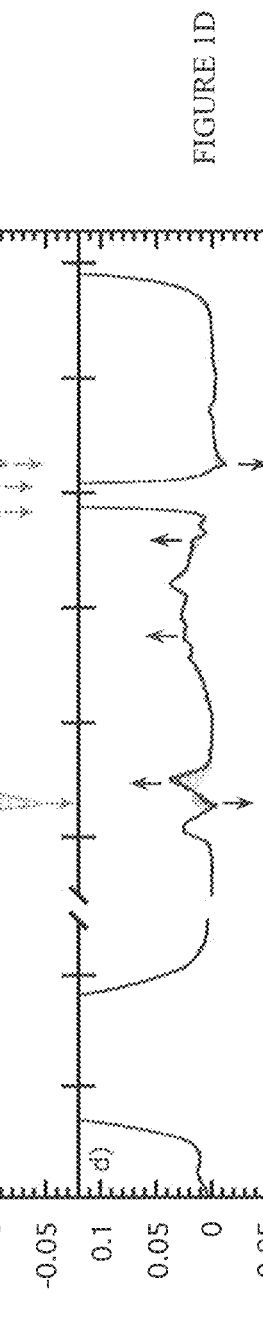
FIGURE 1A
FIGURE 1B
FIGURE 1C
FIGURE 1D

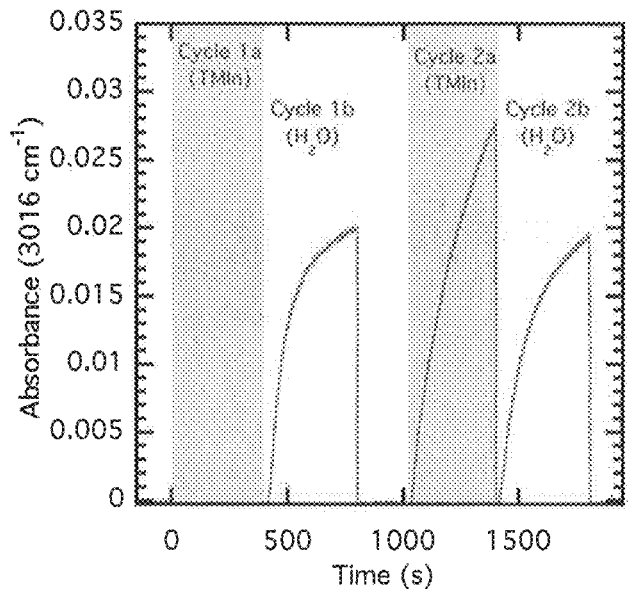
FIGURE 10
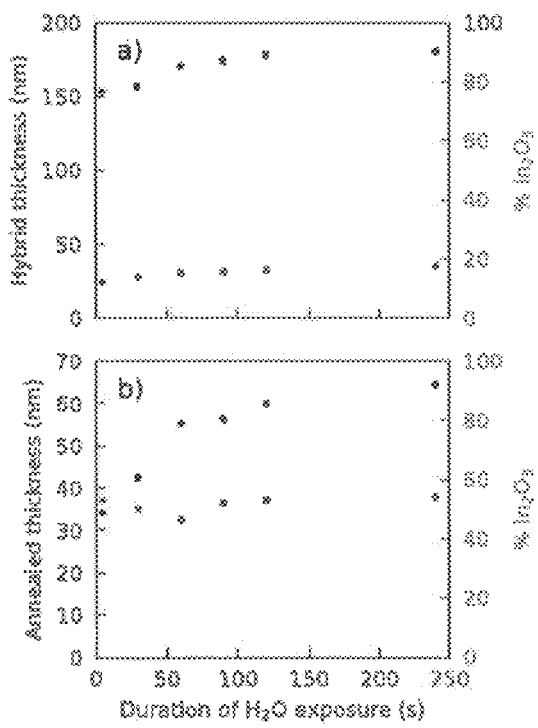
FIGURE 11A
FIGURE 11B

SEQUENTIAL INFILTRATION SYNTHESIS OF GROUP 13 OXIDE ELECTRONIC MATERIALS

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates to synthesis methods. More particularly, the present disclosure relates to systems, methods, and compositions for the formation of group 13 oxides by sequential infiltration synthesis ("SIS").

BACKGROUND

SIS enables inorganic hard or hybrid hard/soft materials to be rapidly fabricated from polymer templates with exquisite microstructural organization and complexity. SIS enables the selective synthesis of robust metal oxides within polymers based on the association of volatile metal-organic precursors with Lewis basic functional groups found within select polymer classes. This distinguishes SIS from traditional atomic layer deposition ("ALD") processes applied to polymeric substrates. While precursor vapors react on the surface of polymers in ALD, in SIS the exposure times are much longer to enable diffusion into the polymer free volume, where vapor residence is often further promoted by adduction to polymer functional groups. Thus, while ALD provides a scheme to form layers on a surface, SIS provides a scheme to form materials within a polymer. SIS's ability to form materials within a polymer have been applied in lithography, oil sorption, protein separations, and optical coatings. Nanostructured metal oxides can be fabricated via SIS using block copolymers as templates, where one block (commonly polystyrene) is inert to SIS and, recently, nanospray dried powders.

While ALD has been extensively studied and includes a large library of available library of materials that have been synthesized. Aluminum oxide ($Al_2O_3$) formed by trimethyl aluminum ("TMAl") and water is by far the most studied SIS system. The SIS approach has been extended to a small selection of other oxides, including $TiO_2$, $ZnO$, and $VO$; however, growth of other materials (e.g., $W/WO_x$ and $SiO$) within polymers requires an SIS $Al_2O_3$ seeding cycle and therefore constitutes a separate class of reactions that only inherit selectivity from the primary (SIS) process. These secondary SIS reactions leverage irreversible reactions with hydroxyl groups present on primary $Al_2O_3$ seeds, in contrast to the (generally) reversible complexation of metal precursors with select polymer functionalities. Materials grown by the seeding method are therefore inherently a mixture of $Al_2O_3$ and the material of interest, which may compromise desired functional properties. However, there remains a need for additional SIS schemes and the ability to form additional materials by SIS.

Because SIS requires the precursor to diffuse into the polymer, the process presents unique complications over ALD, including reactivity of the precursor with the polymer or other base material into which it is diffusing, as well as the kinetics of the precursors diffusion, reaction, and/or purging from the base material. Expanding the library of materials accessible via primary SIS processes will require novel combinations of polymer classes, metal precursors, and process conditions. Extending the library to include electrically conductive materials further requires an improved mechanistic understanding of diffusion, adduct formation, metal-organic chemistry, condensation, and crystallization that occurs within the soft templates.

SUMMARY

At least one embodiment relates to a method depositing a group 13 oxide. The method includes providing a base material in a reactor and depositing an oxide of indium or gallium using a SIS process. The SIS process includes at least one cycle of pulsing a first metal precursor comprising indium or gallium into the reactor for a first metal precursor pulse time, exposing the base material to the first metal precursor for a first metal precursor exposure time and at a first partial pressure, the first metal precursor infiltrating at least a portion of the base material and binding therein with the base material, purging the reactor of the first metal precursor, pulsing a co-reactant precursor into the reactor for a first co-reactant pulse time, exposing the base material to the co-reactant precursor for a co-reactant precursor exposure time and at a second partial pressure, the co-reactant precursor infiltrating at least a portion of the base material and binding therein to form the oxide, and purging the reactor of the co-reactant precursor.

In another embodiment, a method relates to depositing a group 13 oxide. The method includes providing a base material in a reactor and depositing an oxide of indium or gallium using a SIS process. The SIS process includes at least one cycle of pulsing a first metal precursor comprising indium or gallium into the reactor for a first metal precursor pulse time, exposing the base material to the first metal precursor to form a first metal adduct between the first metal precursor and the base material within the base material, purging the reactor of the first metal precursor for a first metal precursor purge time that is less than the lifespan of the first metal adduct, pulsing a co-reactant precursor into the reactor for a first co-reactant pulse time, exposing the base material to the co-reactant precursor for a co-reactant precursor exposure time and at a second partial pressure, the co-reactant precursor infiltrating at least a portion of the base material and reacting with the first metal adduct within the base material to form the oxide, and purging the reactor of the co-reactant precursor.

Another embodiment relates to a composition of matter comprising a polymer and an oxide of indium or gallium deposited therein.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE FIGURES

FIG. 1A shows infrared spectra of a 138 nm polymethylmethacrylate ("PMMA") thin film (gray regions) with vibrations of an isolated methyl methacrylate ("MMA") fragment predicted from first-principles computation (red lines). Also shown are time-lapsed infrared difference spectra of PMMA thin film upon exposure to TMAl for 0, 47, 93, 186, 279, 372, 465 seconds (FIG. 1B); trimethylindium ("TMIn") for 0, 4, 5, 6, 7, 9 seconds (FIG. 1C); and trimethylgallium ("TMGa") for 0, 3, 4, 6, 7, 9 seconds (FIG. 1D). Y-axis scaling is equivalent for all panels; however, times selected for TMIn and TMGa are at least one order of magnitude smaller than those for TMAl.

In FIG. 4B, the absorbance is normalized to its value immediately preceding exposure to vacuum.

FIG. 10 shows absorbance at 3016 cm$^{-1}$ after baseline subtraction, assigned to methane gas, revealing the irreversible reaction byproduct released during water exposure as well as during the second, but not first, TMIn exposure.

FIGS. 11A-11B show pectroscopic ellipsometry-modelled thickness and composition of In$_2$O$_3$ SIS film growth for as-deposited film after five SIS cycles (FIG. 11A) and films post-annealed in air as a function of water exposure (FIG. 11B).

DETAILED DESCRIPTION

Figures 2A, 2B, 2C, 2D:
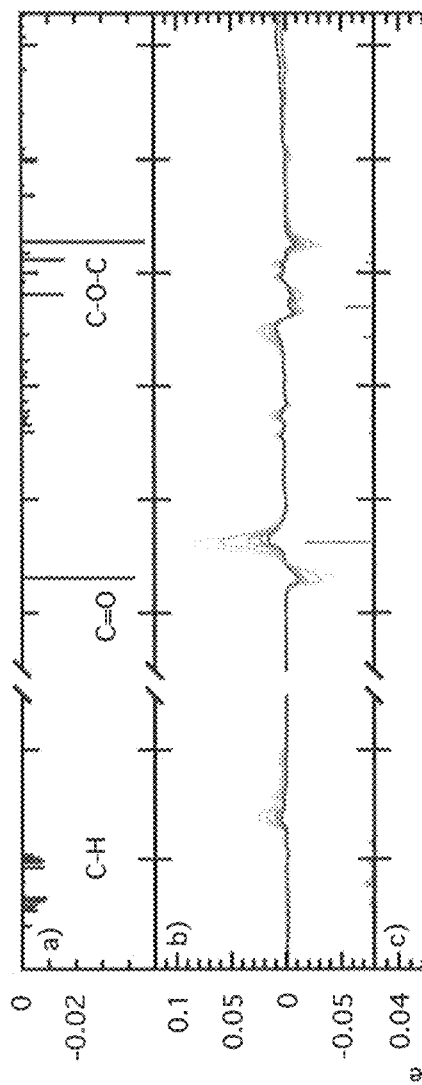
FIG. 2A shows vibrations of an isolated MMA fragment predicted from first-principles computation (red lines) inverted to predict PMMA bleach signal. Also shown are time-lapsed infrared difference spectra of PMMA thin film after removal of gas phase TMAl after 100, 300, 500, 700, 1000 seconds (FIG. 2B); TMIn (FIG. 2C); and TMGa after 1, 4, 10, 30, 70, 210 seconds (FIG. 2D). The primary bleach and absorption peak after TMIn and TMGa exposure are highlighted for comparison to TMAl. The vibrational frequency of computationally predicted modes of the lowest energy trimethyl-X ("TMX")-PMMA complexes are also included below each experimental spectra. The spectral time slices selected for TMIn and TMGa are at least ~10 times shorter than that for TMAl.

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Certain embodiments relate to SIS processes for In$_2$O$_3$ and Ga$_2$O$_3$, two semiconducting oxides for which neither primary nor secondary SIS has previously been reported, via group 13 metal alkyl precursors, such as TMIn and TMGa, respectively. Also described herein are experimental results and computational validation of the chemical mechanism and exceptional kinetics that control selective association of these metal-organic precursors with the ester in PMMA. The physical and electronic properties of the oxide formed with TMIn are reported for the as-grown PMMA-oxide hybrid material and after polymer removal. Surprisingly, embodiments of the described SIS method allow for the growth of indium oxide (In$_2$O$_3$) films above 150 nm in thickness, at a remarkably linear rate of ~12 nm per 100 nm of initial PMMA for each SIS cycle. Lastly, Hall probe measurements verify that ample electrical conductivity can be achieved in In$_2$O$_3$ films grown by SIS, establishing SIS as a viable synthetic method for transparent conductive metal oxides. The experimental/computational approach taken in this work can help enable the design a wider range of primary SIS processes to further expand the functional material SIS library.

In one embodiment, each SIS process consists of a cycle, which may be repeated to form a supercycle, with a first metal precursor vapor pulse (such as TMIn or TMGa), for example for 5 seconds, followed by a first metal exposure, for example 30 seconds in a sealed vacuum valve, followed by a first metal precursor purge, such as 5 seconds, where the reactor is pumped to a vacuum, followed by a co-reactant pulse (such as water), for example for 2 seconds, with a co-reactant exposure, for example 60 seconds, followed by a co-reactant purge, such as for 120 seconds. It should be appreciated that more complicated SIS schemes can be constructed as a supercycle comprising various subcycles for depositing a material as described, such as varying the parameters for any of the individual steps within a cycle.

The described SIS process involves the infiltration of a first metal precursor and a co-reactant precursor into a base material and results in the deposition of the respective group 13 metal or metal oxide, for example $In_xO_y$ and $Ga_aO_b$, such as $In_2O_3$ and $Ga_2O_3$. In particular, stoichiometric variations are envisioned as a consequence of the duration of vapor exposure and purge. Further, stoichiometric variations can be achieved by the use of different co-reactant precursors. In addition, it should be appreciated that dopants may added between cycles of depositing the group 13 oxides. For example, material can be doped directly through the SIS process by substituting the first metal precursor for one or more cycles with an appropriate dopant precursor and the doping level could conceivably be controlled with the exposure of dopant precursor and purge time. Dopants may include, but are not limited to, Zn and Sn.

The base material may be selected from polymers that have a Lewis basic function group. The base material may include PMMA, Poly(vinylpyrrolidone) ("PVP"), and poly (acrylic acid) ("PAA"). The base material may be included as part of a hybrid materials, such as block-co-polymers utilizing the same with another polymer inert to the selected precursors. The base material is preferably free of residual materials, such as solvents, that are reactive with the precursors, such as the first metal precursor and the co-reactant precursor.

In some embodiments, the first metal precursor vapor pulse comprises input to the reactor of the first metal precursor vapor for a first metal precursor vapor pulse time of 0.5 seconds to 30 seconds (e.g., 0.5, 1, 5, 10, 20, 30 seconds, inclusive of all ranges and values therebetween), such as 5 seconds. The first partial pressure of the first metal precursor vapor pulse can be in the range of 0.01 Torr to 10,000 Torr (e.g., 10, 25, 50, 75, 100, 500, 1000 Torr, inclusive of all ranges and values therebetween), in one embodiment at least 50 Torr and in a pressurized reactor embodiment at least 1000 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD and SIS reactions. Note, for ease of reference herein the process is described with regard to the pulse duration but it is understood that the precursor partial pressure is what dictates the diffusion boundary conditions.

In some embodiments, the first metal precursor exposure comprises exposing the base material to the first metal precursor for a first metal exposure time and a first partial pressure of the first metal precursor so that the first metal precursor infiltrates at least a portion of the base material (e.g., infiltrates beneath the surface) and binds with the base material. The first metal exposure time can be in the range of 0.5 seconds to 500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1 and 10 seconds, for example about 5 seconds. The first partial pressure of the first metal precursor can be in the range of 0.01 Torr to 10 Torr (e.g., 0.01, 0.05, 0.1, 0.5, 1.0, 5.0, 10 Torr, inclusive of all ranges and values therebetween). In some embodiments, the first partial pressure of the first metal precursor is in the range of 0.1 Torr and 1 Torr, for example about 0.5 Torr.

The first metal precursor purge evacuates unreacted precursor from the reactor. The first metal precursor purge may be for a first metal precursor purge time of 0.5 seconds to 30 seconds (e.g., 0.5, 1, 5, 10, 20, 30 seconds, inclusive of all ranges and values therebetween), such as 5 seconds. The first metal precursor purge reduces the pressure in the reactor to within the range of 0.01 Torr to 10 Torr (e.g., 0.01, 0.05, 0.1, 0.5, 1.0, 5.0, 10 Torr, inclusive of all ranges and values therebetween), such as substantially to vacuum.

In some embodiments, the base material can be heated to a predetermined temperature during the SIS process. For example, the first predetermined temperature can be in the range of 50-200° C. (e.g., 50, 60, 70, 80, 90, 100, 110, 120, 130, 140, 150, 160, 170, 180, 190 or 200° C., inclusive of all ranges and values therebetween). In some embodiments, the predetermined temperature is in the range of 70-90° C., for example 85° C. In some embodiments, the first predetermined temperature can be in the range of 120-140° C., for example 135° C. Temperature also impacts the overall energy in the system and the performance for diffusion and/or reaction. As described in some of the examples, a temperature of 80° C. was selected, which is lower than the typical aluminum deposition temperature (90-95° C.). It is believed that at temperatures above the recited 90° C. changes the lifetime of the metal complex with PMMA and that it is longer-lived at lower temperatures. This allows the TMIn/TMGa to remain long enough (5 seconds in the examples below is the minimum purge time to prevent vapor-phase overlap) in the polymer for when the water comes to co-react.

In some embodiments, first metal precursor includes, for example, dimethylaluminum isopropoxide and aluminum tri(isoproxide), trimethyls, triethyls, or acetylacetonates of the group 13. For example, the first metal precursor may be one of TMGa or TMIn.

The base material, after reaction with the first metal precursor, is then exposed to a second precursor—the co-reactant precursor—by a co-reactant pulse introducing the co-reactant to the reactor and then exposing for the co-reactant exposure such that the second co-reactant precursor reacts with the first metal precursor to form the inorganic material on or within the base material.

In some embodiments, the first metal precursor vapor pulse comprises input to the reactor of the first metal precursor vapor for a co-reactant precursor pulse time of 0.5 seconds to 30 seconds (e.g., 0.5, 1, 5, 10, 20, 30 seconds, inclusive of all ranges and values therebetween), such as 2 seconds. The first partial pressure of the co-reactant precursor pulse can be in the range of 0.01 Torr to 10 Torr (e.g., 0.01, 0.05, 0.1, 0.5, 1.0, 5.0, 10 Torr, inclusive of all ranges and values therebetween).

In some embodiments, exposing the base material to the co-reactant precursor for a co-reactant precursor exposure time and a second partial pressure of the co-reactant precursor so that the co-reactant precursor infiltrates at least a portion of the base material (e.g., infiltrates beneath the surface) and reacts with the moiety formed by the first metal precursor reacting with the base material. The co-reactant precursor exposure time can be in the range of 0.5 seconds to 500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), for example about 60 seconds. The second partial pressure of the co-reactant precursor can be in the range of 0.01 Torr to 10 Torr (e.g., 0.01, 0.05, 0.1, 0.5, 1.0, 5.0, 10 Torr, inclusive of all ranges and values therebetween). In some embodiments, the second partial pressure of the co-reactant precursor is in the range of 0.1 Torr and 1 Torr, for example about 0.5 Torr.

The co-reactant precursor purge evacuates unreacted precursor from the reactor. The co-reactant precursor purge may be for a co-reactant precursor purge time of 0.5 seconds to 500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 120 seconds. The co-reactant precursor purge reduces the pressure in the reactor to within the range of 0.01 Torr to 10 Torr (e.g., 0.01, 0.05, 0.1, 0.5, 1.0, 5.0, 10 Torr, inclusive of all ranges and values therebetween), such as substantially to vacuum.

In some embodiments, the second co-reactant precursor may include one or more of water, hydrogen peroxide, and ozone. Note, varying the co-reactant may also vary the stoichiometry of the resultant oxide coating. Further precursors may include nitrous oxide, hydrogen, formaldehyde, trimethyl aluminum, ammonia, hydrazine, dimethyl hydrazine, diethyl hydrazine, methyl-ethyl hydrazine, hydrogen sulfide, trimethyl phosphite, trimethyl phosphate, silane, disilane, or any combination thereof. For example, the first metal precursor can be TMGa or TMIn and the second co-reactant can be water.

Any number of cycles of exposing the base material to the first metal precursor and the second co-reactant precursor can be performed to reach a depth within the base material that the inorganic material has infiltrated as well as amount of inorganic material deposited therein. In some embodiments, the number of cycles of the SIS process can be in the range of 1-50 (e.g., 1 cycle, 2, 3, 4, 5, 10, 15, 20, 25, 30, 35, 40, 45, or 50 cycles, inclusive of all ranges and values therebetween). In some embodiments, up to 10 cycles of the SIS process provide for linear growth and are used to form a desired thickness of the inorganic material on the base material.

In general, the SIS process involves exposing the base material, which can be formed from an organic material, to various gas phase precursors (e.g., the first metal precursor and the second co-reactant precursor) to synthesize the inorganic material, similar to ALD. However, contrary to other deposition methods, such as ALD, which only forms the inorganic material on a surface of the substrate, SIS coats the surface of the substrate but also infiltrates into the bulk substrate. This is achieved by adjusting the partial pressure and time of the gas phase precursor exposures (i.e., the first metal precursor and the second co-reactant precursor). In some embodiments, the total time of exposure to first metal precursor and/or the second co-reactant precursor during SIS cycle may be 5-1000 times higher, and the partial pressures may be 5-10,000 times larger than the typical time and partial pressure for an ALD cycle.

In some embodiments, the SIS process may include relatively long periods of gas phase exposure and high partial pressure of the first metal precursor and the second co-reactant precursor. For example, the SIS method may include a relatively long period of gas phase exposure and high partial pressure of the first metal precursor followed by a long period of exposure and high partial pressure of the second co-reactant precursor. In various embodiments, a purging step can be performed in-between exposure to the first metal precursor and the second co-reactant precursor. With regard to ALD, a main differentiation is in the purge time after the metal precursor dose. In SIS the adduct that forms is transient such that the wait/purge time after adduct formation (but before second precursor exposure) will determine the loading. The purge time for prior SIS processes, such as those using TMA, have focused on 60 seconds or longer purge times to ensure adequate purging, contrary to the concepts presented herein focusing on a short adduct lifespan significant less than prior purge times.

For example, the base material can be positioned in a hermetically sealed chamber pumped to vacuum. The base material is exposed to the first metal precursor for the first predetermined time (e.g., between 1 second and 500 seconds) and the first partial pressure (e.g., between 0.01 Torr and 10 Torr). The chamber is then evacuated and/or purged with an inert gas (e.g., nitrogen, argon, or any other inert gas) before exposing the base material to the second co-reactant component. In another embodiment, the method may include a series of short pulses of the first metal precursor followed by another series of short pulses of the second co-reactant precursor. In some embodiments, a series of short pulses may be combined with long periods of gas phase exposure to the first metal precursor and/or the second co-reactant precursor.

The first metal precursor infiltrates within the base material and selectively binds (either covalently or non-covalently) to a functional group of the base material (e.g., a carbonyl group). The second co-reactant precursor is selectively reactive with the first metal precursor that is bound to the base material. For example, the first reactive gas may be a ligated metal, such as a transition metal organic, and the second reactive gas may be water. In some embodiments, a third precursor may be used. For example, a dopant can be deposited either as less than a single atomic layer (ad-islands or particles) or as a dopant layer, such as to alter conductivity or magnetic properties.

The SIS process results in the growth of the inorganic material in a sub-surface region of the base material associated with the first metal precursor and the second co-reactant precursor used as well as, in some embodiments, on the surface of the base material. In some embodiments, the inorganic material can form an inorganic layer that may have a thickness in the range of 0.2 nm to 5,000 nm. In some embodiments, the inorganic material can infiltrate the base material via SIS so as to infuse the base material polymer with the inorganic material to a depth of 0.05 micron to 1,000 microns.

One of skill in the art will appreciate that the SIS parameters described herein may be varied based on the overall reaction parameters. For example, high temperatures (above 95° C., such as up to 150° C., could be utilized if the reactor was engineered to quickly remove excess metal precursor such that water could then be quickly introduced (i.e. minimal pumping/purging time) in order to capture/quench the adduct before it (more) quickly dissociates at high temp. Further, temperatures below 80° C., such as down to 60° C. or down to room temperature, could be utilized in some embodiments.

Experimental Results and Analysis.

Experimental results demonstrate an expansion of the primary SIS materials library to include two electronically functional materials: $In_2O_3$ and $Ga_2O_3$. Infrared spectroscopy of metal-organic infiltration and association kinetics, supplemented by DFT calculations of TMX-MMA configuration and binding energies, inform SIS processing conditions which yield ample deposition of $In_2O_3$. A comparison of TMIn and TMGa to the canonical example of TMAl reveals that the later reversibly binds more strongly to the carbonyl functional group in PMMA. Though Fourier-transform infrared spectroscopy ("FTIR") evidence suggests that slightly more TMAl associates within a given volume of PMMA for an equal partial pressure in the long-time limit, a much lower barrier to activated diffusion for TMGa and TMIn enables more complete saturation of adduct formation in much short times.

Surprisingly, the TMIn SIS at low temperature and with $H_2O$ enables tens-of-nanometers-thick $In_2O_3$ film growth under conditions which would produce little to no ALD deposition on flat inorganic substrates after hundreds of cycles. It is believed that the molecular configuration of the PMMA-TMIn/Ga complex allows for the completion of the reaction by water at ~80° C., whereas the energy barrier to the standard ALD molecular structure is too high at this temperature. This is a significant difference from prior SIS and ALD work with deposition of alumina, which can proceed at low temperature. The effects of polymer conformation and composition, along with alternative oxygen sources may enable further tunability of the structural and electronic properties of SIS derived materials.

In-Situ FTIR Spectroscopy.

Figure 13A:
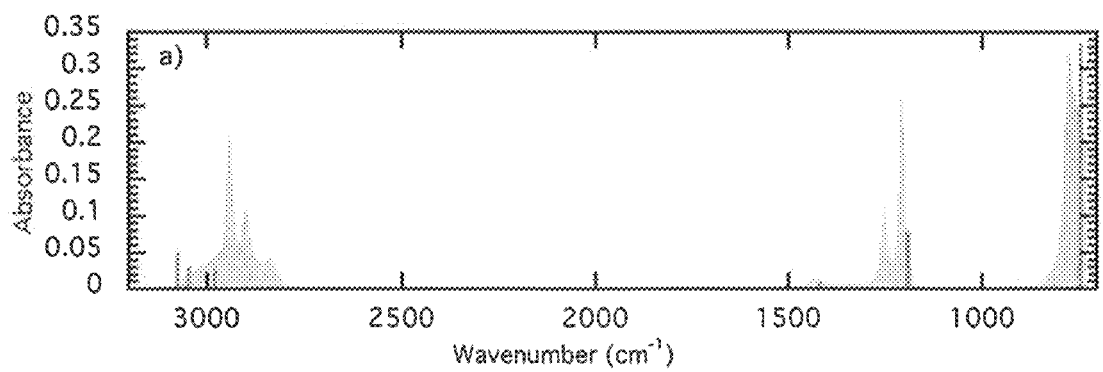
FIG. 13 shows the infrared spectra of a gas phase TMA (FIG. 13A), TMIn (FIG. 13B), and TMGa only (no polymer) (FIG. 13C) overlaid with calculated vibrations of each precursor derived from first-principles computation (PBE).
Figure 13B:
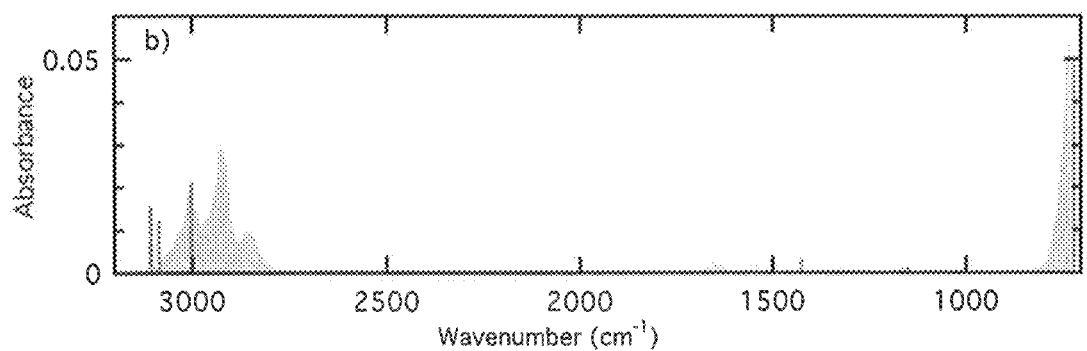
Figure 13C:
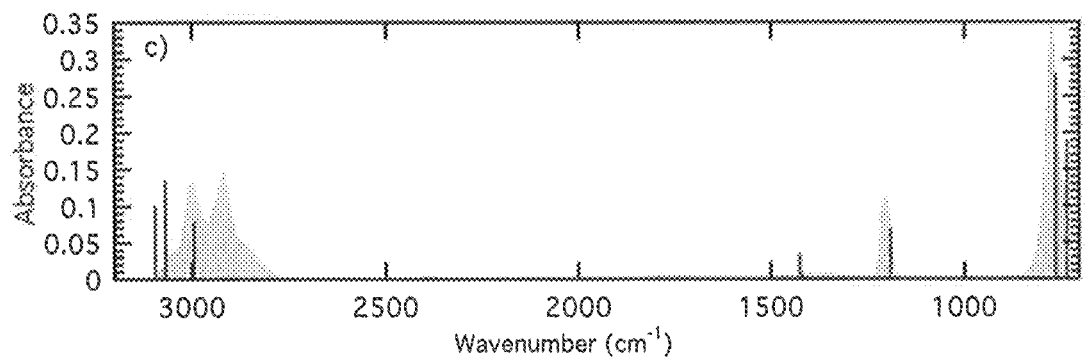

Thin films of PMMA with 138 nm thickness were spin-coated from toluene onto 60 nm of electron-beam evaporated Au on a Si wafer substrate to enable infrared absorption spectroscopy in reflection mode. Toluene was chosen as an inactive solvent to SIS, residual solvents that are Lewis basic can act as SIS sites in otherwise SIS-inert polymers. A thick, undoped Si window that is o-ring sealed to a cutout in the flat growth chamber lid allows infrared probe beam access into and out of the ALD reaction chamber. In this configuration, and without any shutters, the probe may interact with the Si/Au/polymer thin film substrates as well as any vapor phase precursors or byproducts present during extended static exposures. The temperature of the ALD chamber was held at 80° C. for all experiments in this work. The infrared absorption spectrum of a PMMA thin film referenced to a bare gold substrate (FIG. 1A) reveals anticipated features near the characteristic functional group frequencies of PMMA, including 1738 cm$^{-1}$ (C=O stretch) and 1152 cm$^{-1}$ (C—O—C stretch). The calculated vibrations (PBE) of the MMA monomer, plotted as red lines with chemical assignments, resemble the experimental spectrum for PMMA. In the absence of a polymer film, the gas phase infrared absorption spectra of the metal organic precursors in the ALD tool were also acquired and resemble the vibrational frequencies predicted from density functional theory ("DFT") calculations of gas phase monomers (FIG. 13). Though an equilibrium between monomeric and dimeric TMAl is present in the gas phase, modelling of the dimeric form is omitted for simplicity, as it may not solvate into the polymer film.

In SIS, static exposure of the polymer film to metal precursor vapor results in infiltration of the latter into the free volume of the former. The reversible association or irreversible reaction of the metal-organic molecules with the polymer film can perturb the vibrational frequencies of polymer functional groups and/or the metal organic complex. FIG. 1B depicts time-lapsed spectra, referenced to the pre-exposure PMMA film spectrum (FIG. 1A), following the introduction of vapor-phase TMAl into the chamber. The spectra include potential contributions from gas-phase TMAl, infiltrated TMAl, reversible TMAl-PMMA adducts, irreversible TMAl-PMMA species, and irreversible TMAl-PMMA reaction byproducts. The signal attributed to TMAl vapor is readily deconvolved through comparison to gas-phase-only spectra and by noting that these peaks quickly saturate as the equilibrium pressure of TMAl vapor in the reaction chamber is achieved within just a few seconds. In contrast, several peaks evolve over minutes time-scale (labeled with arrows in FIG. 1), which have previously been assigned as the signature of largely reversible TMAl-PMMA adduct formation.

For example, the carbonyl stretch of pristine PMMA at 1738 cm$^{-1}$ is slowly bleached, while a new peak assigned to a C=O—Al(CH$_3$)$_3$ adduct grows in at significantly lower wavenumber, ~1675 cm$^{-1}$. SIS with analogous group 13 metal alkyls, TMIn and TMGa, which have not been previously considered, results in qualitatively similar spectra. However, these grow in at a rate at least 10 times faster than the TMAl case (FIGS. 1C-1D). The timescale (seconds) of TMIn-PMMA and TMGa-PMMA association would be surprising if purely diffusive transport of TMX precursors through PMMA were taking place, given their comparable size but significantly larger molecular weight relative to TMAl. Instead, the more rapid bleach of the carbonyl stretch of PMMA supports a previously advanced hypothesis that diffusion through the PMMA is further controlled by the association/dissociation kinetics of the TMX-PMMA adduct.

The infrared spectra of the three TMX-PMMA adducts share many spectral features, but also differ in significant ways. First, the C=O—In(CH$_3$)$_3$ and C=O—Ga(CH$_3$)$_3$ features are significantly less red-shifted (Δv=37 and 44 cm$^{-1}$) from the pristine PMMA C=O peak relative to C=O—Al(CH$_3$)$_3$ (Δv=66 cm$^{-1}$), which suggests that TMAl forms the most tightly bound adduct. Second, the share of carbonyls participating in adduct formation varies significantly among the group 13 metals selected. The fraction of carbonyl groups associated to the metal alkyl precursors can be monitored through the absolute magnitude of the PMMA C=O bleach. The absolute value of the bleach in all cases is less than that of the pristine PMMA C=O absorption, which indicates that some population of carbonyls in the PMMA do not associate with TMX. A larger partial pressure of TMX was observed to increase the concentration of TMX dissolved in the polymer which, in turn, increased the equilibrium concentration of adducts. However, the energy of the PMMA-TMX adduct plays a role independent of the vapor pressure. For example, although much greater TMGa vapor pressures are achievable (Table 1), as is clear from the much larger alkyl stretching intensity of the vapor in the 2900 cm$^{-1}$ region (FIG. 1d), the absolute magnitude of the equilibrium C=O bleach follows TMAl>TMIn>TMGa.

TABLE 1

| Vapor pressures of TMX compounds. | | |
|---|---|---|
| Compound | Precursor Vessel Temp | Predicted Vapor Pressure |
| TMAl | 25° C. (no heating) | 11.5 Torr |
| TMIn | 50° C. | 11.5 Torr |
| TMGa | 25° C. (no heating) | 227 Torr |

Upon subsequent pumping of the SIS reaction chamber to rough vacuum, any non-infiltrated TMX vapor is quickly pumped away (less than 1 second). Therefore, shortly after pumping, the remaining vibrational features (still referenced to a pristine PMMA film) correspond exclusively to differences in the PMMA film (negative features/bleaches) or to the presence of a PMMA-TMX adduct (positive features/absorption) (FIG. 2A). Time-lapsed spectra clearly reveal adduct dissociation (i.e., reversibility) in the case of all metal alkyls, however, the dissociation of C=O—Al(CH$_3$)$_3$ occurs on a time scale at least 10 times longer than for either TMIn or TMGa. As can be seen in FIGS. 2A-2C, the vibrational frequency of computationally predicted modes of the lowest energy TMX-PMMA complexes are also included below each experimental spectra. The spectral time slices selected for TMIn and TMGa are at least ~10 times shorter than that for TMAl.

Density Functional Theory.

Figure 3:
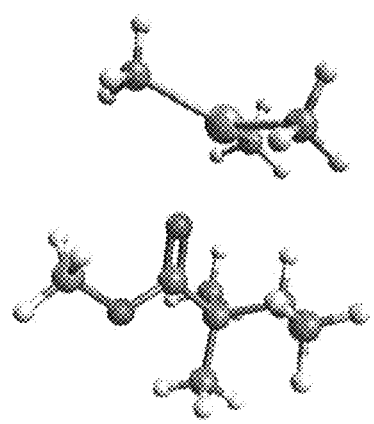
FIG. 3 Shows the lowest energy configuration of the MMA-TMX adduct (X=Al, In, Ga). The atom coordinates of energy minimized structures for each metal are similar, as reported in Table 1.

First, principle DFT calculations were performed to identify the minimum-energy conformations of three potential alkyl metal-MMA adducts. The energies for each adduct for each TMX are tabulated in Table 2. The lowest-energy adduct for each of the three compounds was identified as the conformation in which the group 13 metal is proximal and roughly in line with the C=O bond. This lowest-energy adduct is nearly isostructural across each TMX molecule, therefore only MMA-TMIn is shown in FIG. 3 (with atom coordinates for each C=O—X(CH$_3$)$_3$ conformation reported in Table 3). Though the same binding geometry is calculated to be the lowest energy complex for each TMX (X=Al, In, Ga), the change in C=O stretching frequency (Δv) and Helmholtz free energy change (ΔF) upon complexation differs appreciably across the metals, Table 4. The vibrational frequencies of eigenmodes calculated for the minimum-energy conformations are included for comparison to experimental spectra in FIG. 2. This experimental shift in C=O stretching frequency upon MMA-TMX association, which is notably larger for MMA-TMAl, is observed to be in good agreement with first principles calculation. It is notable that the predicted infrared spectra for all of the other low-energy conformations do not share this excellent agreement with experiment.

TABLE 2

Helmholtz free energies for the three TMX-MMA adducts for each metal. In all three cases conformation b) where the metal is in proximity to the C=O bond has the lowest Helmholtz free energy.

| Compound | CH$_3$—X(CH$_3$)$_3$ | C=O—X(CH$_3$)$_3$ | (O=C)(CH$_3$)O—X(CH$_3$)$_3$ |
|---|---|---|---|
| TMAl | −0.000654 eV | −0.447 eV | −0.0471 eV |
| TMIn | −0.0875 eV | −0.165 eV | −0.0341 eV |
| TMGa | −0.0793 eV | −0.131 eV | −0.0768 eV |

TABLE 3

Atomic coordinates of the lowest energy conformation MMA and metal alkyl adduct.

| | | MMA-TMAl | | | | |
|---|---|---|---|---|---|---|
| H | −0.77961 | 0.48263 | −2.51854 | C | 2.52877 | −1.37028 | 3.93374 |
| H | 0.94320 | 0.79613 | −2.30234 | C | 0.23791 | −3.21875 | 2.34759 |
| Al | 0.73248 | −1.45968 | 3.11167 | C | −0.70784 | −0.44847 | 4.01541 |
| C | 2.74694 | 1.59445 | 1.10355 | H | 2.81105 | −0.35248 | 4.22255 |
| H | 3.37401 | 0.74291 | 1.35964 | H | 3.31330 | −1.75061 | 3.27089 |
| H | 2.25617 | 1.96080 | 2.00313 | H | 2.57797 | −1.97470 | 4.84550 |
| H | 3.33049 | 2.38066 | 0.63575 | H | −1.65095 | −0.43866 | 3.46050 |
| H | −1.40667 | −0.99939 | 0.81565 | H | −0.43496 | 0.59329 | 4.21246 |
| H | −2.10951 | −0.62559 | −0.74262 | H | −0.92794 | −0.89813 | 4.98965 |
| H | −2.08869 | 1.82493 | −0.17619 | H | 1.00615 | −3.63360 | 1.68694 |
| H | −1.33164 | 1.45605 | 1.37929 | H | −0.70902 | −3.22767 | 1.79889 |
| H | −2.95580 | 0.89615 | 1.03883 | H | 0.12118 | −3.94001 | 3.16451 |
| | | MMA-TMIn | | | | |
| C | −0.03397 | −0.10147 | −0.65862 | H | 3.46468 | 2.36344 | 0.36118 |
| C | 1.00236 | 0.30575 | 0.37274 | H | −1.33151 | −0.95534 | 0.82513 |
| C | −0.08154 | 0.85573 | −1.84494 | H | −2.10393 | −0.59908 | −0.70442 |
| C | 0.38019 | −1.49756 | −1.14604 | H | −2.09923 | 1.85142 | −0.14959 |
| C | −1.40208 | −0.20469 | 0.03581 | H | −1.26664 | 1.50375 | 1.37082 |
| C | −1.94012 | 1.09173 | 0.61656 | H | −2.89788 | 0.91759 | 1.10769 |
| O | 1.09893 | −0.18494 | 1.47693 | C | 2.65087 | −1.36564 | 4.21956 |
| O | 1.84426 | 1.23863 | −0.04278 | C | 0.23192 | −3.48975 | 2.31510 |
| H | −0.34845 | −1.85165 | −1.87702 | C | −0.99297 | −0.46685 | 4.18278 |
| H | 0.41471 | −2.20932 | −0.32191 | H | 2.83532 | −0.31212 | 4.43350 |
| H | 1.35781 | −1.47483 | −1.63088 | H | 3.40966 | −1.71942 | 3.52028 |
| H | −0.29239 | 1.88040 | −1.54285 | H | 2.77068 | −1.92214 | 5.15132 |
| H | −0.86813 | 0.53350 | −2.52956 | H | −1.88189 | −0.55170 | 3.55697 |
| H | 0.86119 | 0.85881 | −2.39059 | H | −0.71321 | 0.58522 | 4.25197 |
| In | 0.65586 | −1.65391 | 3.40767 | H | −1.25657 | −0.80663 | 5.18655 |
| C | 2.87010 | 1.61596 | 0.87735 | H | 1.05196 | −3.74829 | 1.64355 |
| H | 3.47976 | 0.75394 | 1.14278 | H | −0.69005 | −3.42062 | 1.73626 |
| H | 2.43250 | 2.03264 | 1.78301 | H | 0.11560 | −4.31322 | 3.02338 |
| | | MMA-TMGa | | | | |
| C | −0.03589 | −0.12758 | −0.63238 | H | 3.43652 | 2.33714 | 0.47244 |
| C | 0.98502 | 0.26753 | 0.41863 | H | −1.35444 | −0.98428 | 0.82952 |
| C | −0.06214 | 0.84098 | −1.81011 | H | −2.10502 | −0.62495 | −0.71114 |
| C | 0.38131 | −1.52001 | −1.12713 | H | −2.11094 | 1.82351 | −0.15086 |
| C | −1.41449 | −0.23254 | 0.04073 | H | −1.29807 | 1.47424 | 1.37986 |

TABLE 3-continued

Atomic coordinates of the lowest energy
conformation MMA and metal alkyl adduct.

| C | −1.96110 | 1.06273 | 0.61606 | H | −2.92522 | 0.88689 | 1.09411 |
|---|---|---|---|---|---|---|---|
| O | 1.07217 | −0.23832 | 1.51682 | C | 2.48900 | −1.36153 | 4.06132 |
| O | 1.82684 | 1.21147 | 0.02969 | C | 0.26047 | −3.28503 | 2.38470 |
| H | −0.33747 | −1.86427 | −1.87245 | C | −0.80421 | −0.51385 | 4.06612 |
| H | 0.40182 | −2.23940 | −0.30949 | H | 2.70262 | −0.31677 | 4.29471 |
| H | 1.36609 | −1.49538 | −1.59722 | H | 3.25582 | −1.72670 | 3.37528 |
| H | −0.27398 | 1.86354 | −1.50177 | H | 2.58647 | −1.93027 | 4.99005 |
| H | −0.83939 | 0.52779 | −2.50948 | H | −1.70478 | −0.54916 | 3.45087 |
| H | 0.88874 | 0.84568 | −2.34146 | H | −0.51677 | 0.53099 | 4.19782 |
| Ga | 0.67515 | −1.58465 | 3.30951 | H | −1.06876 | −0.90346 | 5.05312 |
| C | 2.83776 | 1.58034 | 0.96988 | H | 1.06750 | −3.59419 | 1.71748 |
| H | 3.44657 | 0.71704 | 1.23285 | H | −0.66919 | −3.24648 | 1.81399 |
| H | 2.38490 | 1.98275 | 1.87449 | H | 0.14488 | −4.07445 | 3.13321 |

FIG. 3 shows the lowest energy configuration of the MMA-TMX adduct (X=Al, In, Ga). The atom coordinates of energy minimized structures for each metal are similar, as reported in Table 1.

TABLE 4

Experimental and first principles calculation of C=O
frequency change, O—X adduct distance, and calculated
Helmholtz free energy change for MMA association with TMX.

| Compound | ν (cm⁻¹) [exp] | Δν (cm⁻¹) [exp] | Δν (cm⁻¹) [DFT] | Distance (Å) [DFT] | ΔF @ 300K (eV) [DFT] |
|---|---|---|---|---|---|
| TMAl | 1675 ± 6 | 66 | 60.2 | 1.974 | −0.447 |
| TMIn | 1704 ± 1 | 37 | 41.1 | 2.466 | −0.165 |
| TMGa | 1697 ± 1 | 44 | 40.8 | 2.277 | −0.131 |

Several other spectral features predicted for MMA-TMX association are also resolved experimentally and are in agreement with computation. These include subtle changes to C—O—C vibrational modes near 1200 cm$^{-1}$, which show both a bleach of the pristine PMMA modes and new absorption features that are assigned to the adducts.

Kinetics.

Figure 4A:
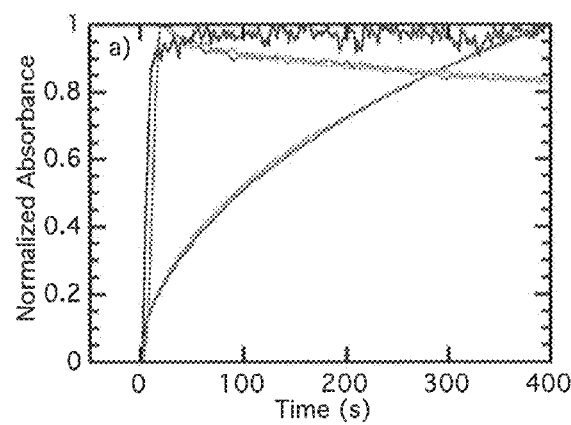
FIGS. 4A-4B show infrared absorption kinetics of TMX association (FIG. 4A) and dissociation (FIG. 4B) with PMMA where X=Al (blue), In (orange), and Ga (green). Normalized PMMA C=O bleach (lighter color, 1741 cm$^{-1}$) and C=O—X(CH$_3$)$_3$ adduct (darker color, see Table 4 for wavenumber) upon exposure to TMX. For comparison, the rapid rate of TMX precursor pumping of TMGa (gray, 1208 cm$^{-1}$), for example, is also shown in FIG. 4B. The data in FIG. 4A are normalized to their maximum absorbance in the first 400 seconds of exposure.

The more detailed kinetics of PMMA-TMX association and disassociation may be resolved through analysis of time-dependent intensity of distinct spectral features with fast (~1 spectrum/second) in situ FTIR spectroscopy during and after TMX exposure. As previously noted, the first features to rise and saturate in each case are those assigned to gas phase TMX, which saturates the reactor headspace within seconds of the ALD valve opening. Next, the spectral features characteristic of MMA-TMX association grow in and saturate on the seconds (TMIn and TMGa) to minutes (TMAl) timescale (FIG. 4A). The minute-scale kinetics for association saturation of TMAl (τ~200 seconds) into a 138 nm thick PMMA film corroborates previous reports. However, the rapid association saturation of TMIn and TMGa with PMMA (τ<10 seconds) is a striking departure that highlights the strong effect of adduct association strength on diffusion. The strong association of TMAl with PMMA, as deduced from first principles calculation, may result in rapid association of TMAl to PMMA in the near-surface. However, the strongly bound MMA-TMAl adduct is expected to be slow to dissociate, which appears to block additional TMAl from diffusing deeper into the film for further association. It is believed that the lower affinity of TMIn and TMGa for PMMA relative to TMAl allows for much greater reversibility of association and therefore faster activated hopping diffusion deeper into the PMMA film. The minor intensity decay of the C=O—In(CH$_3$)$_3$ signal during long exposure follows the slow loss of TMIn gas from the SIS reaction chamber due to imperfect gate valve seal performance. This dynamic equilibration of PMMA-TMIn complex with variable gas-phase TMIn concentration is further evidence for rapid association-dissociation of this adduct.

Figure 4B:
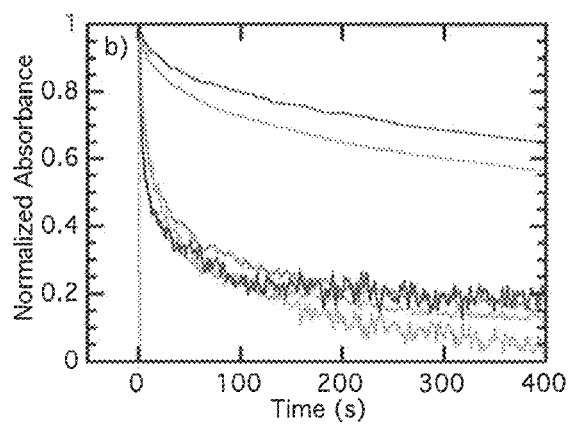

Upon pumping the SIS reaction chamber, the features assigned to gas phase TMX in the headspace are, as expected, the first to be removed (FIG. 4B). The rate of PMMA-TMX dissociation (and concurrent pumping of TMX as it is released) are again similar for TMIn and TMGa but in stark contrast to TMAl. The kinetics of TMAl release fits a bi-exponential decay in which an initial faster component (τ~85 seconds, 25%) contributes less than a slower component (τ~2000 seconds, 75%). Both lifetimes are similar to those previously published for TMAl SIS. In contrast, the decay of vibrational signatures of TMIn and TMGa adducts with PMMA are significantly faster. The kinetics of TMIn and TMGa dissociation also fit a bi-exponential decay, however the faster 11<τ<23 seconds component accounts for the majority of the contribution (56-64%). The smaller contribution of the decay fits to a slower and more variable lifetime (170<τ<1400 seconds). The difference in the kinetics of dissociation further suggests that the MMA-TMAl is more strongly bound relative to the MMA-TMIn and MMA-TMGa complexes, in qualitative agreement with DFT simulations. However, a quantitative analysis of the bi-exponential decay kinetics is beyond the scope of this initial report. The temperature of the polymer film is an important parameter to approach in future quantitative kinetic studies as temperature drastically effects the infiltration rate of TMX into PMMA, both in terms of the stability of the TMX-MMA adduct and the diffusivity of TMX in the film. While the adducts described herein appear to be reversible within the timescales explored experimentally, evidence of irreversible reactions between TMAl and carbonyls has been reported for extended (hours) vapor exposures. Irreversible reactions between TMAl and other Lewis basic functional groups on substituted phenyls have been observed, suggesting that single component irreversible reactions between TMAl and organic molecules can be designed.

The significantly faster infiltration rates of TMIn/TMGa observed by FTIR suggests these weakly complexing precursors would diffuse deeper into thick films than TMAl in the same exposure time. Thus, engineering weaker interactions between vapor precursors and polymer functional groups may be a route to overcome diffusion-limited deposition profiles for SIS in macroscopic polymer structures over practical time-scales. Experiments have verified films up to 400 nm thick.

In order to successfully template the growth of metal oxides within PMMA via SIS, the TMX-PMMA complex must be quenched with a reactive oxygen source prior to complete dissociation and out-diffusion. While ideally the SIS process would proceed with 100% conversion and reaction efficiency, balancing the overall process requires consideration of the time necessary to purge the first metal precursor (to prevent CVD like reaction with the co-reactant and the first metal precursor) and quickly introducing the co-reactant before the adducts vanish. In one embodiment, the SIS process may proceed wherein over a certain amount (e.g., 50%, 60%, 70%, 80%, 90%, inclusive of all ranges and values therebetween) of the first metal adducts are reacted. For example, one utilizes at least 70% of the adducts present under equilibrium with TMX gas, the oxygen source ("B half-cycle") must be supplied within the lifespan of the adduct, roughly within five seconds of purging for TMIn or TMGa. In contrast, more than 120 seconds of purging may be tolerated in order to capture at least 70% of the TMAl-PMMA complexes present in a 140 nm PMMA film at 80° C. As such, purge time can be utilized as an operational parameter for the SIS process such as to control the stoichiometry of the resultant coating. Purging the prior precursor gas before exposing the subsequent precursor gas would ideally be instantaneous, but in reality the gas must traverse the base material and reactor for purging, so there is a period of time necessary for the purge. The purge should be set to be less than the lifetime of the adducts, which for the experiments described herein was set at 5 seconds.

Thus, while the commonly used and extensively studied TMAl/PMMA structure includes strong polymer/metal bonds, it has been discovered that there is a tradeoff for that bond strength in that species such as TMIn or TMGa have weaker polymer bonds but more weakly bound adducts. TMAl requires much longer time to diffuse into and out of films relative to TMIn/TMGa, however the long timescale offers a convenient experimental variable—purge time—to tune the deposition rate/cycle of the SIS process. In the case of TMIn/TMGa under the same process conditions, the timescale for adduct dissociation and diffusion of TMX out of thin films are comparable to the purge times necessary to prevent gas-phase mixing of reactants (CVD) and therefore offer less fine-tuned control over growth rate. However, the rapid adduct formation rate suggests that $In_2O_3$ and $Ga_2O_3$ may be deposited much deeper into polymer thick films over experimentally convenient times, where $Al_2O_3$ may not.

Film Growth.

Figure 14:
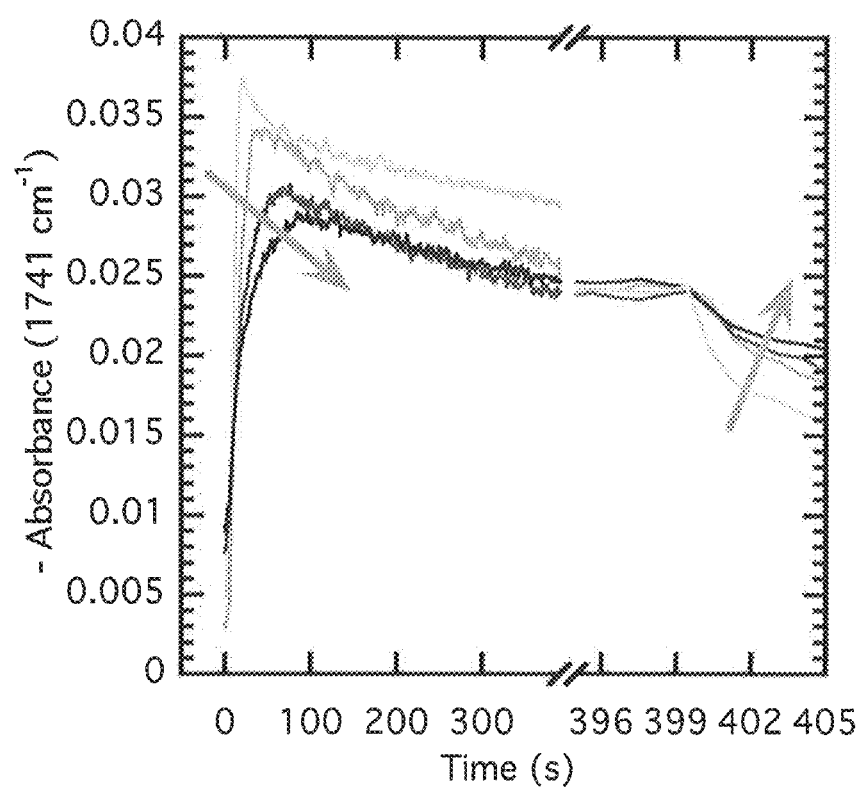
FIG. 14 is a graph of the absolute value of absorbance at 1741 cm$^{-1}$ during SIS cycles 1-4 (from lighter to darker gray). The absorbance during cycle 1 (lightest gray) has been normalized after the x-axis break for better visualization of dissociation kinetics. The kinetics of association during absorption and dissociation during desorption are both measurably slower in successive cycles.

While the diffusion of and association of TMAl with PMMA has previously been investigated via FTIR, the time-resolved chemical effect of $H_2O$ quenching (ALD-analogous "B" cycle) has not. The first four full cycles of TMIn SIS (TMIn exposure, purge, $H_2O$ exposure, and purge) were probed with in situ FTIR in order to examine the involvement of PMMA in the chemical reactions that occur upon water exposure/quenching. The baseline and bleach of the C=O feature of pristine PMMA at 1741 $cm^{-1}$ is roughly equal for each of the first four SIS cycles (FIG. 14). This suggests that the ester functionality is not consumed upon quenching of the PMMA-TMIn adduct with $H_2O$, but is instead released for future adduction with TMIn in subsequent SIS cycles. Notably, this is distinct from other reports with TMAl in which peaks associated with adduct-forming polymer groups are lost, indicating direct incorporation of the metal oxide or polymer chain scission. The role that polymer functionalities play in subsequent secondary SIS cycles, when there are metal oxide surfaces in the film for the metal-bearing precursor to chemisorb to, is still an open question. However, the rate at which the adduct signature saturates systematically decreases with cycle number, which suggests a reduction in the diffusion rate as the PMMA is "filled" with $InO_x(OH)_y$. The changing diffusive landscape in the film is presumably affected by both physical and chemical changes as SIS proceeds. The physical presence of metal oxyhydroxide nuclei within the polymer free volume may block pathways previously accessible for adsorption and diffusion. Similarly, the rate of TMIn-PMMA dissociation also appears slowed, at least during the five second window allowed for TMIn gas purge before the introduction of $H_2O$. It is believed that in some embodiments the time constant of the diffusion is being changed, resulting in an exponentially increasing overall time. Alternatively, the diffusion rate may be held relatively constant while the kinetics change due to the film thickness increasing with each subsequent SIS cycle.

Experiments.

Figures 5A, 5B:
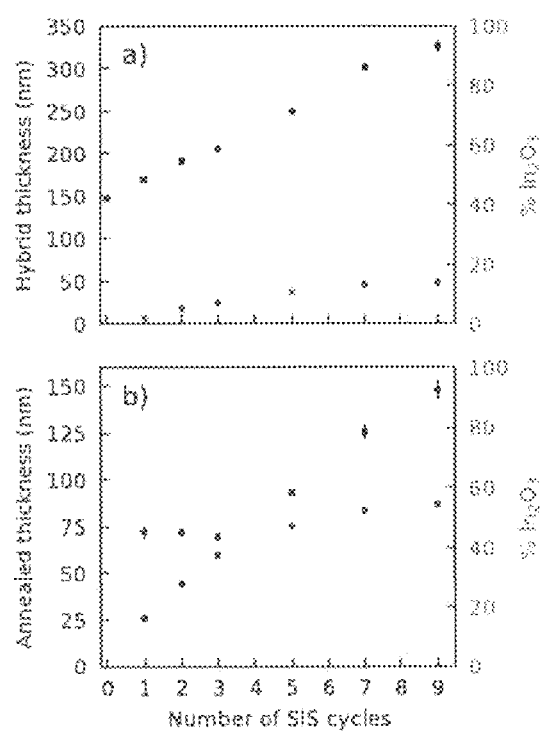
FIGS. 5A-5B show spectroscopic ellipsometry-modelled thickness and composition of In$_2$O$_3$ SIS film growth for as-grown composite of PMMA and In$_2$O$_3$ (FIG. 5A) and In$_2$O$_3$ films following polymer removal (FIG. 5B).

With the mechanistic understanding of the rate of adduction and diffusion in the TMIn systems, the SIS processing conditions for growth of $In_2O_3$ in PMMA were explored. A series of samples was prepared with a total of 1, 2, 3, 5, 7, and 9 SIS cycles, where each SIS cycle consists of a (5-30-5-2-60-120) process sequence. This nomenclature refers to a 5 second pulse of TMIn vapor, 30 seconds of exposure to TMIn with a sealed vacuum valve, followed by five-seconds of pump and purge to vacuum, followed by a two second water pulse and 60 seconds of water exposure, followed by a 120-second pump and purge. Reference silicon wafer samples included in this study showed no deposition of material by ellipsometry, which suggests that CVD-like reactions due to cross-talk of vapor-phase precursors did not take place, despite the relatively brief (5 seconds) purge after TMIn exposure. In a second control experiment with a Si wafer, 200 cycles of a short (0.015 seconds, ALD-like) dose of TMIn followed by a very large water exposure (5 second dose+60 second exposure, SIS-like) also showed no growth. Longer water purges are important to minimize the amount of water retained in the film for the next cycle of TMIn, which could otherwise provide a direct reaction pathway outside of primary or secondary SIS. In fact, water can be intentionally dosed before the metal-organic precursor to grow material in polymers. The PMMA was spin-coated to an initial film thickness of 147.5 nm as measured by variable angle spectroscopic ellipsometry. The hybrid PMMA/$In_2O_3$ films that result from SIS are modeled as an effective medium with variable total thicknesses and volume % of $In_2O_3$ (FIG. 5A). The Bruggeman EMA model fits two Cauchy-parameterized components of constant refractive index equal to the pristine PMMA thin film (A=1.49, B=0.00125, C=0) and literature values for $In_2O_3$ (A=1.9503, B=0.036512, C=0). The total thickness of the as-grown film swells roughly linearly at a rate of 20.6 nm/SIS cycle while the volume fraction of $In_2O_3$ begins to saturate over five SIS cycles. Atomic force microscopy scans of the pristine PMMA, 1 cycle, and 9 cycle films suggest an increase in roughness with cycle number. Hybrid PMMA/$Ga_2O_3$ films that result from SIS were not systematically studied as function of cycle number but also show a ~2× increase in hybrid film thickness over four cycles, clearly indicating $Ga_2O_3$ growth.

Figure 6:
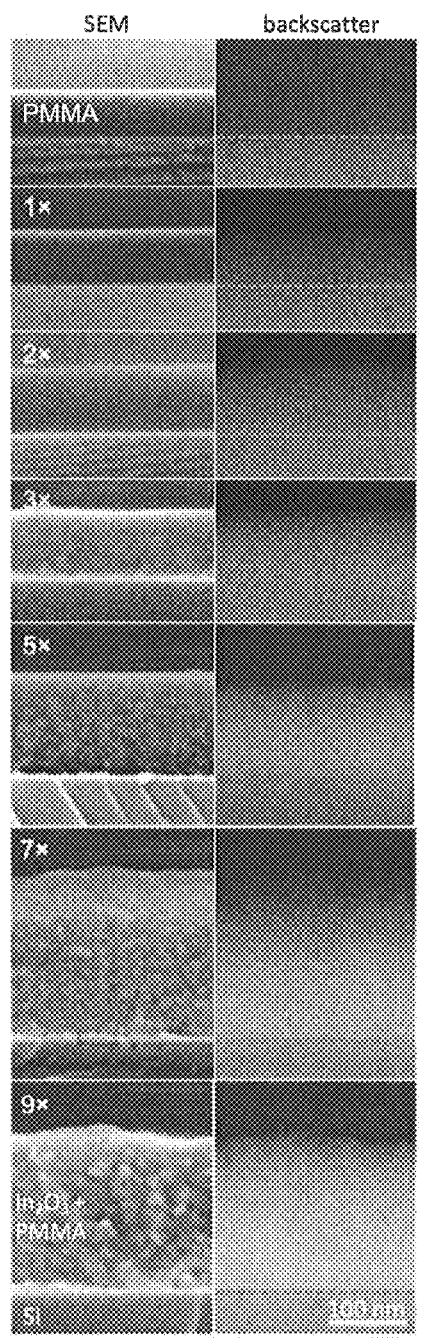
FIG. 6 shows cross-sectional scanning electron microscope ("SEM") images of In$_2$O$_3$ SIS in PMMA thin films for increasing cycle numbers. The left-hand column shows SEM images that reveal topographic information, while the right-hand column shows only the higher energy backscattered electron signal, in which brightness is indicative of high-Z elements. The blue dotted line is included as a visual cue of the film/substrate boundary.

Cross-sections of hybrid PMMA/$In_2O_3$ films were prepared for imaging by SEM to assess the distribution of the inorganic deposit through the thickness of the film. FIG. 6 shows the evolution of the film as a function of number of SIS cycles. The left column shows standard SEM images of the film cross-section, whereas the right column shows images collected using a detector that filters out secondary electrons and only collects backscattered electrons. While secondary electrons are generated from the sample itself and contain topographic information about the surface, backscattered electrons are generated by the elastic collisions between the source beam and the sample and are typically of much higher energy and probe deeper into the sample. Backscattered electrons are more likely to be derived from high atomic number elements due to the elastic nature of the collisions by which they arise. Since In (Z=49) is significantly heavier than the C, O, H that constitute the initial PMMA film, the brightness of the backscattered signal can aid in determining the $In_2O_3$ distribution. For example, while the standard SEM image of the PMMA and the 1×SIS sample appear quite similar, the backscattered image for the SIS sample is considerably brighter, which indicates the incorporation of $In_2O_3$. Furthermore the thickness of the 1× sample is increased relative to the pristine PMMA film. With increasing SIS cycles the film continues to swell and some contrast/roughness becomes apparent in the topographic images, with apparent grain size that increases with additional SIS cycles. The backscattered signal also increases with cycle number, though the intensity from film surface to substrate is relatively constant. This suggests that the 148 nm thick PMMA films are well-within the diffusion length of the TMIn SIS process. It should be appreciated that longer exposure times can be utilized for deeper diffusion.

The maximum intensity of backscattered signal is below the film surface each case, suggesting that the inorganic deposit at the film surface is of lower density than deeper into the film. This decrease in inorganic deposit density at the near surface has been observed in reports of SIS TMAl using both time-of-flight secondary ion mass spectroscopy ("TOF-SIMS") and cross-sectional energy dispersive spectroscopy ("EDS"). The effect was proposed to emerge as a consequence of the local decrease of glass transition temperature and increase of free volume in the near-surface of polymer thin films.

Figure 7:
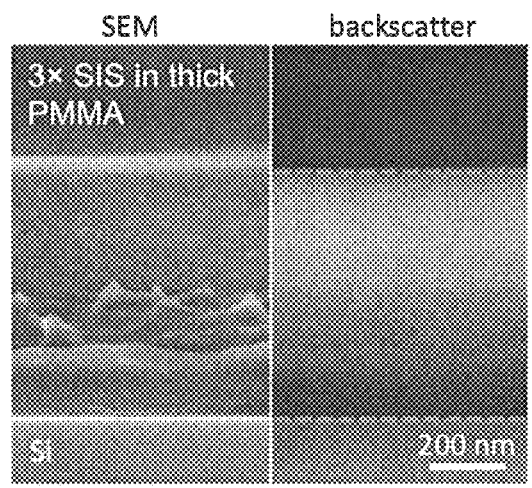
FIG. 7 is a cross-sectional SEM image of a thick (~500 nm) PMMA film after 3 cycles of In$_2$O$_3$ SIS. Morphologically, a clear transition between a In$_2$O$_3$-rich top layer and a plastically deformed PMMA-rich bottom layer. The backscattered signal supports a diffusion-limited In$_2$O$_3$ gradient with a decreasing signal deeper into the film. Blue dotted lines at the film interfaces are included as a visual cue.

To assess the impact of diffusion-limited transport of TMIn on the through-film distribution of the resulting $In_2O_3$, a thick (>500 nm) PMMA thin film was prepared with 3 SIS cycles. A cross-section of this film was also imaged by SEM (FIG. 7). The cross-section of this thicker film reveals a clear transition from the hybrid material from the top ~400 nm to the bottom ~250 nm of material. The top section reveals the roughness/contrast that was observed across the entirety of the thin films in FIG. 6. The lower section lacks this contrast and appears to have fractured more like a plastic. Likewise, there is a clear decrease in backscatter intensity at the bottom of the film, suggesting a significant drop in $InO_x$ content. The bands in backscattered intensity at the bottom of the film are likely an artifact of the non-planar fractured surface. As anticipated from kinetic studies, longer exposures would be required to achieve full diffusion in thicker films.

The as-grown films measured in FIG. 5A were subsequently annealed at 400° C. in air for three hours to remove the polymeric content by pyrolysis. The ellipsometric response of the resulting films was fit to an EMA model with variable total thickness and fraction of $In_2O_3$ and void (air). The post-annealed oxide films, which range from 44-54% $In_2O_3$, exhibit a linear increase in thickness for each SIS cycle performed (~17 nm/SIS cycle) (FIG. 5B). Therefore, the total swelling rate of the as-grown hybrid films slightly exceeds the final $In_2O_3$ growth rate of the annealed films. This lower rate is attributed to dehydration and densification of the as-deposited $InO_x(OH)_y$ while the polymer is simultaneously removed by pyrolysis at high temperature.

Figure 8:
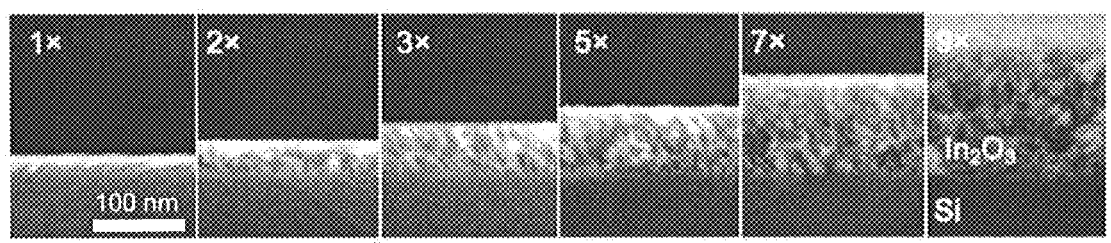
FIG. 8 shows cross-sectional SEM images of annealed In$_2$O$_3$ films for increasing SIS cycle numbers. A mesoporous morphology with increasing thickness is observed.
Figure 9:
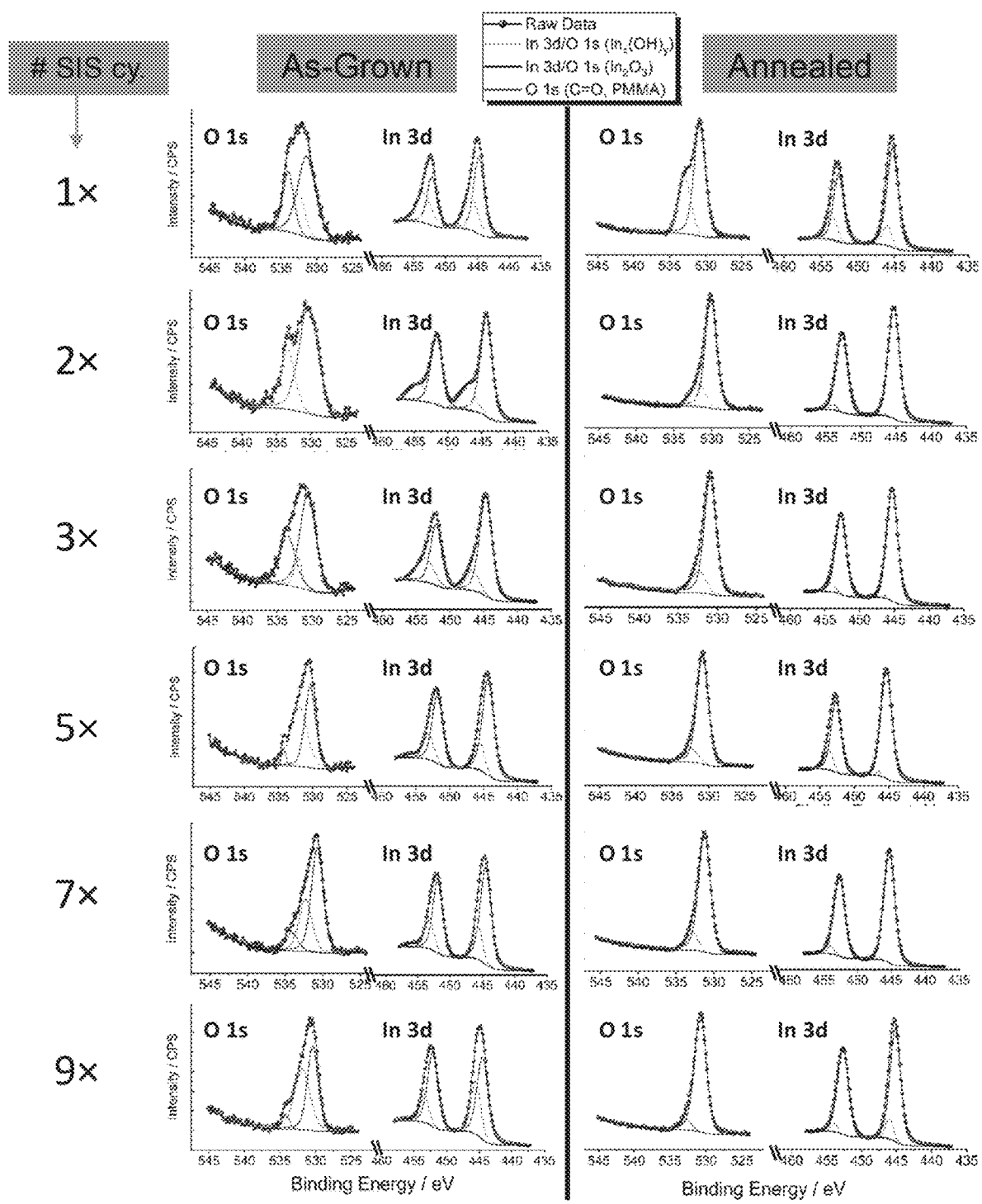
FIG. 9 shows HR-XPS spectra of the O is and In 3d regions corresponding to the number of SIS cycles for as-grown In$_2$O$_3$-PMMA composite (left panel) and In$_2$O$_3$ films after PMMA removal (right panel).

Furthermore, changes in polymer free volume and chain conformation during SIS are not well understood and could impact the density of each component. The mesoporous nature of the annealed films was confirmed by top-down SEM images, however the marginally increased density with cycle number as derived from ellipsometry fitting is difficult to corroborate. FIG. 8 shows cross-sectional SEM images of the annealed films that further confirm their mesoporous nature and the approximately linear growth rate modeled through ellipsometry. The range of porosity and pore sizes possible are the subject of future investigations. Under these processing conditions, $In_2O_3$ is deposited at a rate of 12 nm per SIS cycle for XPS surface analysis of the PMMA/$In_2O_3$ composite (as-grown) as well as annealed films was performed on the samples described in FIG. 5 to assess the bonding environments of the SIS-grown $In_2O_3$ surfaces. The In 3d and O 1s regions for these materials are shown in FIG. 9. The as-grown composite of PMMA and $In_2O_3$ (FIG. 5A) has two distinct chemical environments as shown in the high-resolution In 3d and O 1s spectra where the dominant bulk oxide ($In_2O_3$) peaks (shaded blue) arise at binding energies of 444.6 eV and 530.9 eV for the In 3d and O 1s sub-shells, respectively. These peaks are shifted ~0.5 eV higher than expected, which may be due to PMMA-induced partial charging that may not be completely compensated by the electron flood gun. Both the In 3d and O 1s regions also have shoulder peaks (shaded green) 533.4 eV that are attributed to the presence of surface OH groups associated with the $In_2O_3$, namely $In(OH)_3$, as well as overlap with the O 1s contribution of the O—C=O moiety of the PMMA. Using the two-cycle case as an example, the relative concentration of $In(OH)_3$ and $In_2O_3$ in the as-grown $In_2Ox(OH)_y$ and PMMA composite is 21%. After removal of the PMMA by annealing in air, the relative amount of hydroxylated $In(OH)_3$ is also observed to decrease significantly to ~3%. Similar trends are observed for other samples (1, 3, 5, 7, and 9 SIS cycles).

Water Exposure Effects.

Irreversible reactions which illuminate the SIS growth mechanism may also be monitored through in situ FTIR of the reaction product gases evolved during exposure mode (closed gate valve). The ALD growth of $In_2O_3$ thin films has previously been reported to occur with alternating exposures of TMIn and $O_3$; however, growth with $H_2O$ at low temperature is surprising. While ALD growth at much higher temperatures (250° C.) has been reported for TMIn and $H_2O$, the growth rate is quite slow. It is believed that the likely irreversible reaction byproduct during low-temperature growth of TMIn and $H_2O$ is methane. Methane may evolve upon reaction of PMMA-TMIn with $H_2O$ to form $InO_x(OH)_y$ as well as during TMIn reaction with $InO_x(OH)_y$ if available. The $InO_x(OH)_y$ produced during the first SIS cycle provides functional groups not present in pristine PMMA films. Therefore, as expected, the evolution of methane is not observed during the first SIS half-cycle (during TMIn exposure) as there are no hydroxyls with which to react (FIG. 10).

However, methane is clearly observed upon water exposure to the adduct in the first SIS cycle. Methane is also produced, as expected, during both the TMIn and water dose in the second cycle, as shown by the signature of methane gas as monitored at 3016 cm$^{-1}$.

The slow generation of the methane signal over hundreds of seconds of water exposure in the TMIn case is quite different from the case of TMAl in which the "B" reaction is very rapid. In situ ellipsometry studies suggest that water diffuses through PMMA at an orders-of-magnitude higher rate than TMAl. Unlike TMIn, a TMAl-prepared surface is also sufficiently reactive with water to enable ALD at low temperatures, even room temperature. To assess the influence of water exposure time on the In$_2$O$_3$ SIS process, a series of samples was prepared in which the water exposure was varied between 5 and 240 seconds. Each experiment was performed for five total SIS cycles on PMMA spin-coated to a thickness of 146 nm on Si wafers. The thicknesses of the as-grown films and annealed In$_2$O$_3$ films were measured and modelled as previously. FIG. 11 reveals that the as-grown hybrid film thickness begins to saturate at water exposures >120 seconds and that the In$_2$O$_3$ fraction saturates even more slowly. While the porosity of the annealed In$_2$O$_3$ films is relatively constant, the total annealed In$_2$O$_3$ film thickness begins to saturate for water exposures >120 seconds. Far lower reactivity for hydrolysis of the second and third alkyl group of TMX have also been reported in solution systems. Taken together, the notably slow reaction kinetics of adducted TMIn with H$_2$O imply that the duration of water exposure is an important variable in In$_2$O$_3$ SIS.

Polymer Selectivity.

Figure 12:
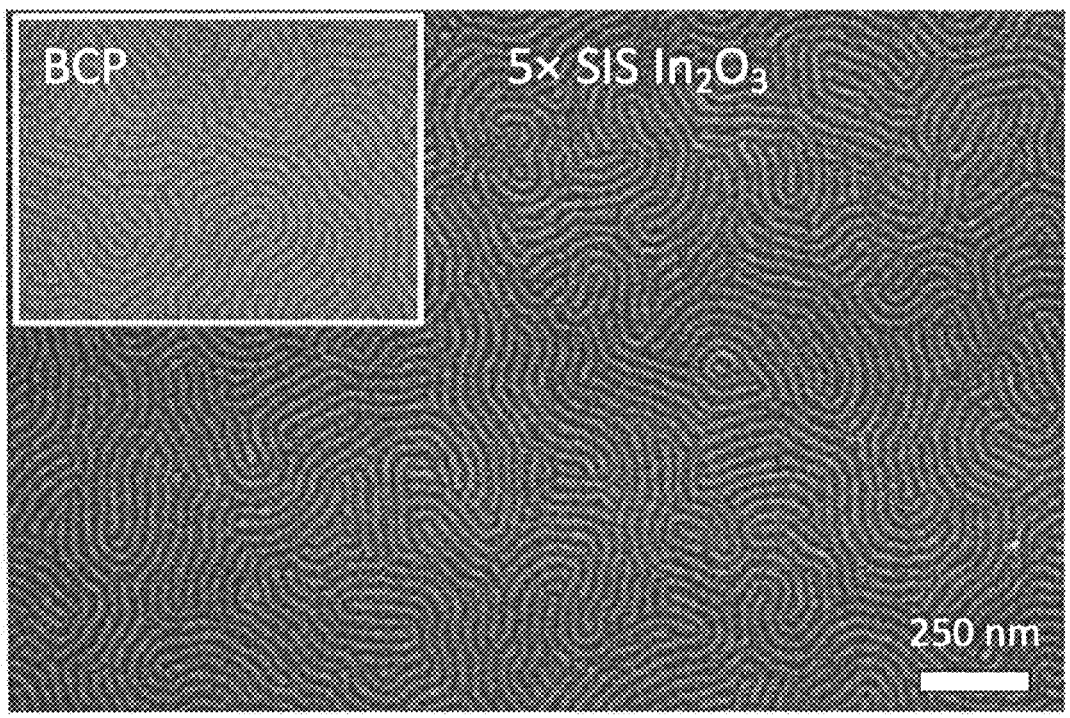
FIG. 12 shows a SEM image of SIS of In$_2$O$_3$ in vertical lamella-forming PS-b-PMMA block copolymer followed by thermal annealing for polymer removal. Indium oxide deposition is restricted to the PMMA and not in the PS through judicious choice of TMIn purge time. The inset of the block copolymer film before processing shows that the original phase-separated morphology is retained after SIS processing.

SIS is particularly well-suited to transform self-assembly materials like block copolymers into hybrid inorganic nanostructures. SIS works in this context due to the selectivity of the deposition between polymers. For example, in the ubiquitous PS-b-PMMA polymer, PS is inert to the metal precursor adduction whereas PMMA, with its Lewis basic ester groups, will adduct some metal precursors, thereby retaining them for much longer. FIG. 12 shows a ~30 nm thick symmetric vertical-lamella forming PS-b-PMMA block copolymer thin film. A neutral surface energy copolymer mat was used to promote the vertical morphology. The inset of FIG. 12 shows the phase-separated block copolymer film before SIS. 5 cycles of In$_2$O$_3$ SIS, followed by thermal removal of polymer, reveal In$_2$O$_3$ nanowires that have directly templated the PMMA domains. This experiment demonstrates that the TMIn SIS process can shows equal selectivity to TMAl in PS-b-PMMA block copolymers.

Electronic Properties.

In$_2$O$_3$, particularly when doped with Sn/Zn, is of technological interest for its good optical transparency combined with low electronic resistivity. In$_2$O$_3$ has been extensively studied and grown by various methods including magnetron sputtering, pulsed laser deposition, and electron beam evaporation. The electrical properties of SIS-grown In$_2$O$_3$ thin films grown on Si substrates with 1 μm insulating thermal SiO$_2$ were examined. After SIS, PMMA was removed via exposure to UV-ozone and subsequently annealed at 400° C. in a reducing environment (3% H$_2$ in N$_2$) to encourage oxygen vacancies that provide charge carriers in undoped In$_2$O$_3$. All films, including those which received only a single SIS cycle exhibit electrical properties characteristic of undoped In$_2$O$_3$ thin films. Effective carrier concentrations are ~1×10$^{20}$ cm$^{-3}$ and mobilities are in the range of ~10 cm$^2$V$^{-1}$s$^{-1}$, as may be expected for the annealed samples which show crystallinity by x-ray diffraction ("XRD"). Using the Scherrer formula for spherical nanocrystallites, the domain size of 10 cycle annealed In$_2$O$_3$ was estimated to be 27 nm. No clear diffractions peaks were observed in XRD measurements of hybrid PMMA/In$_2$O$_3$ films prior to annealing. Resistivities of these annealed films, regardless of SIS cycle number, were of order 10$^{-3}$ Ω-cm, which is comparable to the values reported for other ALD-grown In O films. Future studies will be required to correlate more detailed effects of atomic connectivity, porosity, and oxygen vacancies on the carrier concentration and Hall mobility of conductive metal oxide films grown by SIS.

Methods.

The following methods were used in the above described experiments.

DFT. First-principle density functional theory calculations were performed using the FHI-aims code (fhi-aims.071914). The "tight" default settings were used for base functions, mesh, and angular momentum decomposition. A molecular fragment consisting of five carbon, two oxygen, and eight hydrogen atoms was used for the methyl methacrylate model. Initial configurations of the MMA-TMX complexes were explored using rapid minimization in the JMOL package. These configurations were subsequently used as input for the FHI-aims structural optimizations with the PBE0 exchange-correlation ("xc") functional and with maximum forces of 0.001 eV/Å. Analogous structural optimizations were performed for the TMAl, TMIn, and TMGa molecules. Vibrational spectra were calculated using the aims vibration wrapper with the PBE xc-functional. Structures were first optimized with PBE xc functional until maximum forces were less than 0.0004 eV/Å. The dynamical matrix was subsequently calculated by displacing the atoms ±0.001 Å along the Cartesian directions and calculating the concomitant change in potential energy, and then diagonalizing the dynamical matrix. The six null-space modes were checked to determine that they had frequencies close to zero and were well below the frequencies of the physical vibrational modes. A few vibrational calculations were made using the PBE0 xc-functional and observed no significant differences in vibrational spectra. Energy differences between the bound MMA-TMX compounds and the free MMA fragment/TMX components were calculated using the PBE0 electronic energies, and rotational and vibrational free energies at 300° K from PBE vibrational and rotational spectra. The vibrational frequency (cm$^{-1}$) of all computed eigenmodes was uniformly increased by 1.2% in order to match the major feature (C═O stretch) of the PMMA experiment to theory.

SIS. SIS experiments were conducted on a Veeco/Cambridge Savannah ALD with lid modified to allow entry and exit of an infrared beam at an angle of approximately 30 degrees after reflection off a IR-reflective sample. In all experiments the temperature of the growth chamber was held at 80° C. The TMIn precursor was heated at 50° C. to boost its vapor pressure, while the TMAl and TMGa precursors were unheated. All processes utilized a constant N$_2$ flow of 5 sccm. PMMA films were held in the chamber under N$_2$ flow and rough vacuum for at least 10 minutes before beginning SIS to drive off water. SIS sequences consist of dose, exposure, and pump/purge steps for both the TMX precursor and for water. The dose time describes the duration over which the ALD valve is opened to allow the desired precursor to fill the growth chamber. Prior to the dose, the stop valve is closed, isolating the reactor from the vacuum pump. The total exposure time is the sum of the dose time and exposure wait time, during which the precursor is held in the sample chamber and $N_2$ continues to flow. Finally, the stop valve is opened to the precursor exposure and to begin the pump/purge. After the TMX purge time has elapsed, the stop valve is again closed, water is dosed, a wait period controls the exposure time, and finally the growth chamber is pumped/purged to complete a single SIS cycle. While the specific SIS deposition schemes were noted with respect to individual experiments, the typical SIS film growth scheme was a (5-30-5-2-60-120) cycle sequence. This nomenclature refers to a 5 second pulse of TMIn vapor, 30 seconds of exposure to TMIn with a sealed vacuum valve, followed by five-seconds of pump and purge to vacuum, followed by a two second water pulse and 60 seconds of water exposure, followed by a 120-second pump and purge.

FTIR. FTIR spectroscopy was performed using the external beam from a Bruker Vertex 70 that was focused by off-axis parabolic gold-coated mirror and directed through a thick undoped Si wafer that served as an infrared window to the growth chamber. After reflection off of the gold-coated sample the infrared beam exits through the same long Si window before being focused by a second off-axis parabolic goal-coated mirror and finally detected with an external LN2-cooled MCT A detector. Typical acquisition parameters averaged 4 scans at 4 $cm^{-1}$ resolution with a scanner velocity of 40 kHz, resulting in a ~1 spectrum/sec. As the FTIR studies focus on TMX precursor dynamics, a purge time after completion of exposure (>400 seconds) which is much longer than that used for SIS (5 seconds) was utilized to map the kinetics of TMX dissociation.

XPS. X-ray photoelectron spectroscopy ("XPS") experiments were carried out using a Thermo Scientific™ K-Alpha+TM spectrometer with a micro-focused monochromatic AlKα (1487 eV) X-ray source with a spot size of 400 μm for the surface analysis. Operational pressures were $\sim 7 \times 10^{-9}$ Torr with dual-beam electron flood gun charge compensation used for all measurements. Regions of interest for In 3d, O 1s, C 1s HR-XPS measurements were scanned with a pass energy of 50 eV. HR-XPS spectra shown herein are after a 5 second low-energy Ar+ sputtering (1 kV) treatment in order to remove surface-bound contaminants and, due to the presence of the PMMA polymer, HR-XPS spectra were not charge-corrected relative to the C is peak for adventitious carbon at 284.8 eV. Spectral post-processing and fitting was performed in Thermo Δvantage (v. 5.977, Build 06436) software using 30% Lorentz-mixed Gaussian line-shapes and Smart backgrounds in all cases.

Spectroscopic Ellipsometry. Ellipsometry measurements were acquired on a J. A. Woollam alpha-SE tool over the 380-900 nm band at 65°, 70°, and 75° using 10-second normal acquisitions. Data were acquired and fit using CompleteEase software.

SEM. SEM images were taken on a Carl Zeiss Merlin microscope at an accelerating voltage of 5.52 kV and a working distance of 3 mm. Cross-sectional samples were cracked under liquid nitrogen to preserve morphology and mounted on 90° vertical stubs. Standard images were collected using the InLens electron detector, while backscattered electron images were collected using the Energy-selective Backscattered ("EsB") electron detector with the filtering grid set to 500 V to deflect topographic secondary electrons.

Atomic Force Microscopy. Non-contact (intermittent) mode atomic force microscopy ("AFM") images were acquired in ambient conditions using the Asylum Research MFP-3D microscope and Nanosensors PPP-NCH AFM probes (204-497 kHz resonance frequency range). AFM images were processed using Gwyddion software.

X-ray Diffraction. XRD spectrum was collected using a Bruker Diffractometer D8 Advance. Cu Kα radiation: 40 mA, 40 kV, Kλ=0.154 nm; a scan step size=0.006° (1 second per step).

Hall Effect Measurements. The carrier concentration and mobility of $In_2O_3$ films deposited on Si wafers with thick thermal oxide were evaluated using a Hall effect measurement system (Ecopia HMS-3000) with 0.57 T permanent magnet.

Definitions.

No claim element herein is to be construed under the provisions of 35 U.S.C. § 112(f), unless the element is expressly recited using the phrase "means for."

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. For example, circuit A communicably "coupled" to circuit B may signify that the circuit A communicates directly with circuit B (i.e., no intermediary) or communicates indirectly with circuit B (e.g., through one or more intermediaries).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above.

What is claimed is:

1. A method of depositing a group 13 oxide comprising:
   providing a base material comprising a PMMA film in a reactor; and
   depositing an oxide of indium or gallium using a sequential infiltration synthesis (SIS) process including at least one cycle of:
   pulsing a first metal precursor comprising trimethylindium or trimethylgallium into the reactor for a first metal precursor pulse time;
   exposing, at a temperature of 70-90° C., the base material to the first metal precursor for a first metal precursor exposure time and at a first partial pressure, the first metal precursor infiltrating at least a portion of the base material and binding therein with the base material to form a trimethyl-X-PMMA adduct with an ester group of the PMMA, where X is indium or gallium;
   purging the reactor of the first metal precursor;
   pulsing a co-reactant precursor into the reactor for a first co-reactant pulse time;
   exposing the base material to the co-reactant precursor for a co-reactant precursor exposure time and at a second partial pressure, the co-reactant precursor infiltrating at least a portion of the base material and reacting with the trimethyl-X-PMMA adduct therein to form the oxide and release the ester group of the PMMA; and
   purging the reactor of the co-reactant precursor,
   wherein the co-reactant precursor is selected from the group consisting of water, ozone, and hydrogen peroxide.

2. The method of claim 1, wherein the first metal precursor pulse time is greater than 0 seconds to 30 seconds.

3. The method of claim 1, wherein the first metal precursor exposure time is greater than 0 seconds to 500 seconds.

4. The method of claim 1, wherein purging the reactor proceeds for a first metal precursor purge time of greater than 0 seconds to 30 seconds and-comprises reducing the pressure within the reactor to substantially a vacuum.

5. The method of claim 4, wherein the first metal precursor purge time is 2 seconds to 5 seconds.

6. The method of claim 1, wherein the co-reactant precursor pulse time is greater than 0 seconds to 120 seconds.

7. The method of claim 1, wherein the co-reactant precursor exposure time is greater than 0 seconds to 500 seconds.

8. The method of claim 1, wherein purging the reactor of the co-reactant precursor proceeds for greater than 0 seconds to 500 seconds and comprises reducing the pressure within the reactor to substantially a vacuum.

9. The method of claim 1, wherein the first metal precursor comprises gallium and the oxide is gallium oxide.

10. The method of claim 1, further comprising depositing a dopant using the sequential infiltration synthesis (SIS) process, the dopant comprising zinc, tin, or a combination thereof.

11. The method of claim 1 wherein the first partial pressure is at least 50 Torr.

12. A method of depositing a group 13 oxide comprising:
    providing a base material comprising a PMMA film in a reactor; and
    depositing an oxide of indium or gallium using a sequential infiltration synthesis (SIS) process including at least one cycle of:
    pulsing a metal precursor comprising trimethylindium or trimethylgallium into the reactor for a metal precursor pulse time;
    exposing the base material to the metal precursor to form a trimethyl-X-PMMA adduct with an ester group of the PMMA, where X is indium or gallium, within the base material;
    purging the reactor of the metal precursor for a metal precursor purge time that is less than the lifespan of the metal adduct;
    pulsing a co-reactant precursor into the reactor for a first co-reactant pulse time;
    exposing the base material to the co-reactant precursor for a co-reactant precursor exposure time and at a second co-reactant partial pressure, the co-reactant precursor infiltrating at least a portion of the base material and reacting with the trimethyl-X-PMMA adduct within the base material to form the oxide and release the ester group of the PMMA; and
    purging the reactor of the co-reactant precursor,
    wherein the co-reactant precursor comprises.

13. The method of claim 12, wherein the at least once cycle comprises at least 10 cycles.

14. The method of claim 12, wherein the SIS is at a reaction temperature of 70-90° C.

15. The method of claim 12, wherein 70% of the trimethyl-X-PMMA adducts are reacted with the co-reactant.

* * * * *